United States Patent [19]
Kondo et al.

[11] Patent Number: 5,146,192
[45] Date of Patent: Sep. 8, 1992

[54] DELAY CIRCUIT OF ULTRASONIC DIAGNOSTIC APPARATUS USING DELAY LINE COMPRISING VARIABLE CAPACITANCE DIODE AND INDUCTOR

[75] Inventors: Toshio Kondo, Kunitachi; Toshio Ogawa, Chiba; Kazunari Ishida, Kashiwa; Akihiro Ueyama, Tama, all of Japan

[73] Assignee: Hitachi Medical Corporation, Tokyo, Japan

[21] Appl. No.: 727,053

[22] Filed: Jul. 8, 1991

[30] Foreign Application Priority Data

| | | |
|---|---|---|
| Jul. 6, 1990 [JP] | Japan | 2-177430 |
| Aug. 31, 1990 [JP] | Japan | 2-228141 |
| Nov. 13, 1990 [JP] | Japan | 2-304080 |
| Jan. 28, 1991 [JP] | Japan | 3-25145 |
| Feb. 18, 1991 [JP] | Japan | 3-43977 |

[51] Int. Cl.$^5$ ............................................. H01P 3/00
[52] U.S. Cl. ............................................. 333/164; 307/320; 73/626
[58] Field of Search .................... 333/164, 156, 32, 33; 307/262, 320; 73/626, 625, 628; 334/15

[56] References Cited

U.S. PATENT DOCUMENTS

| | | | |
|---|---|---|---|
| 3,391,347 | 7/1968 | Bosse et al. | 307/320 |
| 4,430,630 | 2/1984 | Sakamoto | 334/15 |
| 4,481,823 | 11/1984 | Alais . | |
| 4,701,714 | 10/1987 | Agoston | 307/320 X |

FOREIGN PATENT DOCUMENTS 60-45830 10/1985 Japan .

OTHER PUBLICATIONS

"NHK Monthly Report", Sho 43,5, pp. 22–27.
"IC Operational Amplifier and Application", p. 182.

Primary Examiner—Eugene R. LaRoche
Assistant Examiner—Ali Neyzari
Attorney, Agent, or Firm—Antonelli, Terry, Stout & Kraus

[57] ABSTRACT

A delay circuit of ultrasonic diagnostic apparatus comprising a delay line consisting of a plurality of unit portions connected in cascade, in each of which an anode of a first variable capacitance diode and a cathode of a second variable capacitance diode are connected with a connecting point of two inductors connected in series, or a delay line obtained by replacing capacitances in a second order all pass type delay line by variable capacitance diodes, or a delay line, in which variable capacitance diodes and inductors form a balanced circuit; and control circuit for applying a reverse bias voltage to each of the variable capacitance diodes; and an amplifier or a variable resistance circuit using FETs serving as a matching circuit for the delay line, capable of varying continuously an input impedance by using a control voltage from the exterior.

23 Claims, 20 Drawing Sheets

DELAY CIRCUIT OF ULTRASONIC DIAGNOSTIC APPARATUS USING DELAY LINE COMPRISING VARIABLE CAPACITANCE DIODE AND INDUCTOR

BACKGROUND OF THE INVENTION

An ultrasonic diagnostic apparatus is constructed so as to send and receive ultrasonic waves to and from a body to be examined by means of a probe to obtain information on the body to be examined on the basis of reflected wave signals coming from the body. In this case, in order to obtain images with a high resolving power for any place in different parts at different depths within the body to be examined, dynamic focusing, by which the focal point for received waves is varied dynamically with the lapse of time, is performed at the reception of the reflected waves coming from the body. At this time, the focussing for the received waves described above is effected by adding received signals coming from different vibrating elements to each other by means of a probe, in which a plurality of vibrating elements formed in a narrow strip shape are arranged, or a probe, in which a plurality of annular vibrating elements are arranged coaxially, after having been appropriately delayed by means of a delay line. This circuit is called generally phasing circuit. Since focal points for the received waves are determined by delay times of the delay line, the dynamic focusing can be realized by varying dynamically the delay times, which are to be given to a plurality of received waves, depending on the depth of generation of the reflected waves coming from the body.

The variation of the delay time described above is performed by disposing a plurality of taps with a suitable interval on the delay line, which are selectively switched by means of electronic switches. In this case, it happened that noise was produced at switching the electronic switches described above, which was mixed in the received signals through the delay line, which gave rise to erroneous signals in diagnostics information. In order to remove such a phenomenon, it is sufficient to use switches generating rarely noise for the electronic switches described above. However, since such an electronic switch is expensive, when a number of switches are disposed, one for every tap of the delay line, cost is raised. Therefore this measure has a drawback that it was not economical.

In order to deal with such a problem, a variable delay line, by which the delay time can be controlled continuously by combining inductors with variable capacitance diodes, whose capacitance varies, depending on the magnitude of the reverse bias voltage, has been proposed in JP-B-Sho 60-45830.

The variable delay line disclosed in this publication will be explained referring to FIG. 1. In FIG. 1, a symbol L indicates an inductor; VC a variable capacitance diode; and C a capacitor. A signal input terminal $T_1$ is disposed at one end and a signal output terminal $T_2$ is disposed at the other end. In this circuit, capacitance elements in a usual LC delay line are replaced by variable capacitance diodes VC. The anodes of the variable capacitance diodes VC are connected in common, to which an analogue control signal is given through a control terminal $T_3$. Further then common connecting point is grounded through a capacitor C. In this way the delay time of the variable delay line is controlled by applying an analogue control signal to the control terminal $T_3$ to vary the reverse bias voltage applied to the variable capacitance diodes VC.

Another variable delay line is described in U.S. Pat. No. 4,481,823, in which inductors L and variable capacitance diodes VC are combined, as indicated in FIG. 2, and on the other hand multi-channel signals are applied to taps disposed with an appropriate interval as a constant current signal source through an amplifier $A_0$. In FIG. 2, a symbol M indicates a matching circuit for the variable delay line thus constructed.

However, in the variable delay line indicated in FIG. 1 or 2 described above, as it can be seen in the respective figure, when a control signal was applied to the variable capacitance diodes VC to vary the reverse bias voltage for controlling the delay time, it happened that the control signal was mixed in the output signal as a noise component. Consequently there was a problem that the S/N ratio of the outputted ultrasonic signal was decreased and thus an obtained ultrasonic image was warsened.

Further, the variable delay line indicated in FIG. 1 had a problem that signals were remarkably distorted, because the capacitance of the variable capacitance diodes VC was varied by radio frequency signals, when the input signal level was high. With this respect, FIG. 3 shows data measured by using a 10-stage variable delay line provided with e.g. a fixed capacitor whose capacitance is 100 pF and variable capacitance diodes VC whose capacitance varies in a region from 20 pF to 500 pF, when the reverse bias voltage $E_c$ is varied in a region between 1 V and 8 V, in the circuit indicated in FIG. 1. In this variable delay line, as it is clearly seen from the measurement result indicated in FIG. 3, although the distortion factor was as low as about 3% when the level of the input signal was low, the distortion factor reaches a value over 20% when the level of the input signal was high. When such a variable delay line was applied to a phasing circuit in an ultrasonic diagnostic apparatus, it happened that characteristics of the ultrasonic diagnostic apparatus were worsened.

Further, in the case where the delay time is controlled by varying the capacitance of the variable capacitance diodes VC, since the characteristic impedance of this variable delay line is varied simultaneously, a problem that it is mismatched, if matching is effected only by terminating it with a fixed resistance R, takes place too.

Concerning this problem, JP-B-Sho 60-45830 discloses a matching circuit using FETs, as indicated in FIG. 4. Each delay line fi in FIG. 4 has the circuit construction indicated in FIG. 1. It is so constructed that the resistance of the terminating resistor of the delay line fi and the gain of a preamplifier ei or a buffer amplifier gi are varied at the same time as change in the delay time of the respective delay line fi so as to compensate each other. A control section P outputs, apart from a delay time controlling signal for the delay line fi, a control signal for the terminating resistor Z provided with field effect transistors and a gain controlling signals for the Preamplifier ei. These control signals are converted into analog signals by a digital-analogue converter DA and given to the variable capacitance diodes in the delay line fi, the field effect transistors in the terminating resistor Z and the variable gain preamplifier ei, respectively, through a signal distributor MX. In this way, the dynamic focusing is realized by varying the control signals for the delay line fi and the terminating resistance Z in the time so that the focal point obtained by the phasing circuit corresponds to the generating point of the ultrasonic reflected wave. However, since the resistance of the terminating resistor Z described above varied, depending on the ambient temperature, characteristics of the phasing circuit were worsened and therefore the property as an ultrasonic diagnostic apparatus was lowered. Further, if there were fluctuations in characteristics of the field effect transistors used in the terminating resistor Z described above, it was necessary to adjust the device in accordance with the characteristics of the different field effect transistors. Furthermore the resistance of the terminating resistor Z described above varied, depending on the magnitude of the voltage of signals applied thereto, and it happened that the characteristics of the device were worsened, caused by distortions in the signals due to this non-linearity.

SUMMARY OF THE INVENTION

The object of the present invention is to provide an ultrasonic diagnostic apparatus using a delay line capable of solving the problems described above.

In order to achieve the above object, a delay line according to the present invention is so constructed that in a delay line composed of a number of unit portions connected in cascade, each unit portion consisting of indicators and a capacitor, the capacitor in the unit portion being substituted by two variable capacitance diodes connected in series, whose capacitance varies, depending on the magnitude of the reverse bias voltage, the phase of high frequency signal voltages applied to these variable capacitance diodes being opposite to each other by connecting the connecting point between the variable capacitance diodes connected in series with the connecting point between the inductors so that when the working point of one of the two variable capacitance diodes described above is moved by the high frequency signal voltage and the capacitance thereof increases, the other is operated so that the capacitance thereof decreases. Further it is so constructed that the two variable capacitance diodes in each of the unit portions have a same polarity, one end of one and the other end of the other in the different unit portions are connected in common, respectively, and reverse bias voltages for the variable capacitance diodes are applied to the common connecting Points so as to control the delay time.

A second delay line according to the present invention is so constructed that in a second order all pass type delay line provided with concentrated constant inductors and capacitors, in order to decrease the number of unit portions connected in cascade, two kinds of capacitors are constructed by variable capacitance diodes having identical variation rates in the capacitance with respect to variation rates in the reverse bias voltage.

A third delay line according to the present invention is so constructed that each unit portion is composed of inductors and variable capacitance diodes in a balanced type circuit so that it is prevented for noise components produced by control electric signals applied to the variable capacitance diodes to be superimposed in ultrasonic signals.

A fourth delay line according to the present invention is so constructed that in order to increase control speed of the delay time by making the rise of the reverse bias voltage applied to the variable capacitance diodes in the first to third delay circuits, the reverse bias voltage applied to the variable capacitance diodes is taken out through a resistor to be detected, a difference voltage obtained by comparing it with a reference voltage for controlling the reverse bias voltage, and a negative feedback control circuit is disposed, which applies the voltage thus obtained to the variable capacitance diodes as the reverse bias voltage.

The matching circuit for the delay line according to the present invention is so constructed that matching is effected by using a variable gain amplifier, whose gain is varied by a control voltage and by varying continuously the input impedance thereof.

In another matching circuit a difference between a potential difference between the source and the drain of an FET driven by a constant current and a control voltage separately disposed is amplified by an amplifier, which is fed back to the gate of the FET and the resistance between the source and the drain of the FET is used as the matching resistance.

DESCRIPTION OF THE PREFERRED EMBODIMENTS

The foundamental idea on the delay line according to the present invention will be explained.

Figure 5:
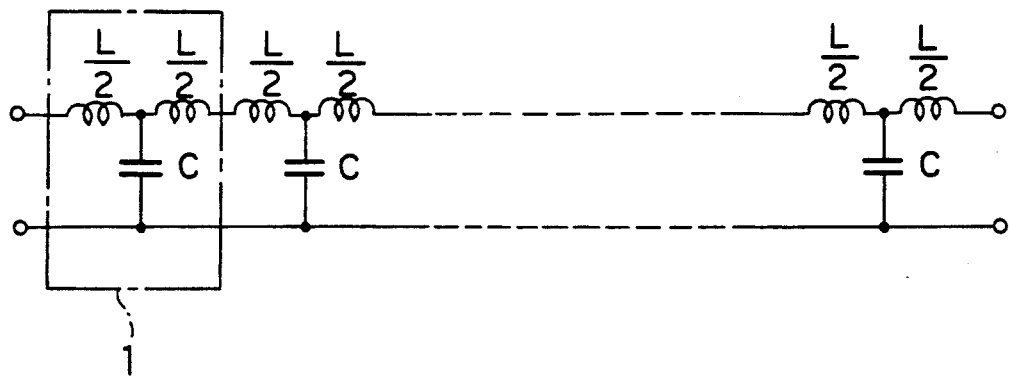
FIG. 5 is a scheme indicating the construction of a lumped constant type delay line.
Figure 6A:
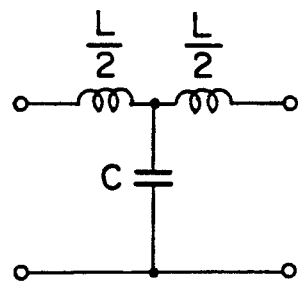
FIGS. 6A and 6B are a circuit diagram and an equivalent circuit diagram thereof, respectively, for a unit portion of the delay line indicated in FIG. 5.
Figure 6B:
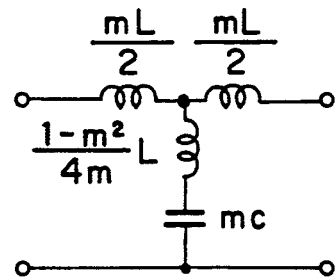

FIG. 5 indicates the construction of the lumped constant type delay line used heretofore in many fields of utilization. This lumped constant type delay line 1 is composed of a number of unit portions, e.g. 10 stages, connected in cascade, each of the unit portion consisting of two inductors L/2, L/2 and a capacitor C, as indicated in the figure, enclosed by a chain-dotted line. The unit portion 1 described above is a T type symmetrical circuit, as indicated in FIG. 6A or 6B. The circuit indicated in FIG. 6A is called constant-K type low pass filter. The circuit indicated in FIG. 6B is an equivalent circuit obtained in the case where the two indicators L/2 indicated in FIG. 6A are coupled magnetically, which is called induced m type low pass filter. Consequently, when m=1, it is the circuit indicated in FIG. 6A.

Here, in the constant-K type low pass filter indicated in FIG. 6A it is supposed that the two ends of the filter are terminated with a characteristic impedance $R_0 = \sqrt{L/C}$.

Now, when an ideal stepwise voltage is applied thereto as an input, the delay time $t_s$ of the output voltage is given by $$t_s = 1.07 \sqrt{LC}.$$

Therefore the whole delay time in the case where n unit portions 1 are connected in cascade, as indicated in FIG. 5, is given by:

$$t_d = n \cdot t_s.$$

Further, when the induced m type low pass filter indicated in FIG. 6B is used for the unit portion, in the case where the ratio of the delay time to the rise time remains unchanged, the number n of stages connected in cascade may be reduced by about 16% with respect to the case where the constant-K type low pass filter indicated in FIG. 6A is used. At this time, if e.g. m=1.27, the overshoot in the waveform of the transferred signal is optimum for the required number of stages. No matter which type of filters indicated in FIG. 6A or 6B may be used, the delay time can be made variable by varying the capacitance of the capacitor C.

In this case, the number of sections N for the required delay time $\tau$ is given by a following formula:

$$N = 0.94 \left( \frac{f_{cn} \cdot \tau}{0.35} \right)^{3/2}$$

where $f_{cn}$ is the cut-off frequency, when N sections are connected in cascade.

Figure 7:
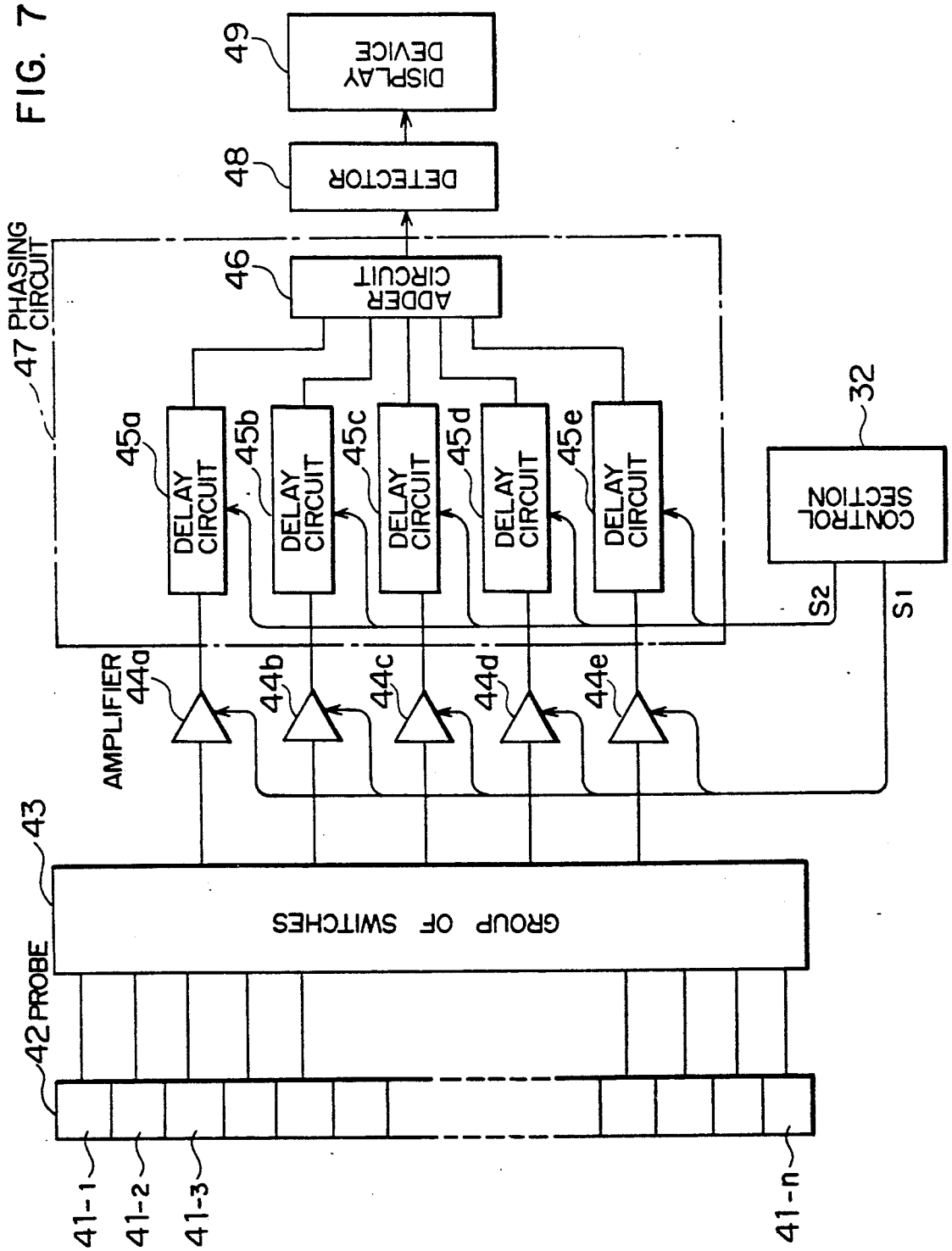
FIG. 7 is a scheme indicating the construction of an ultrasonic diagnostic apparatus using a delay circuit according to the present invention.

FIG. 7 is a block diagram indicating an embodiment of the ultrasonic diagnostic apparatus using a delay line according to the present invention. This ultrasonic diagnostic apparatus is used for the purpose of obtaining a tomographic image for a diagnosed part of a body to be examined, using ultrasonic wave in a linear scanning form or a sector scanning form. It comprises a probe 42 consisting of a plurality of vibrating elements 41-1, 41-2, ..., 41-n, arranged in one row, transmitting and receiving ultrasonic wave, each of which is formed e.g. in an elongated strip shape; a group of switches 43 switching selectively only one group of vibrating elements among the vibrating elements 41-1 to 41-n of this probe 42 one after another; a plurality of amplifiers 44a to 44e, in which signals of received waves from one group among the vibrating elements 41-1 to 41-n of the probe 42 described above are inputted through this group of switches 43 and which increases the gain in the time and corrects the signal intensity, depending on the depth of diagnosis; a phasing circuit 47 including a plurality of delay circuits 45a to 45e giving the signals outputted by these amplifiers 44a to 44e predetermined delay times and provided with an adder 46 adding the signals of received waves, whose phases are adjusted by these delay circuits 45a to 45e; a detector 48 detecting a signal thus phased by this phasing circuit 47; and a display device displaying a signal outputted by this detector 48 in an image. In FIG. 7, the group of switches 43 is so constructed that the probe consisting of 5 groups of vibrating elements, one vibrating element is selected from every group from one end thereof to be connected with the amplifiers 44a to 44e, respectively, in the succeeding stage, and the vibrating elements of the 5 groups described above are switched one after another so that 5 signals proceed in parallel. Consequently there are disposed 5 amplifiers 44a to 44e. The operation of the amplifiers 44a to 44e is controlled by a control signal $S_1$ from the control section 32.

Each of the delay circuits 45a to 45e in the phasing circuit 47 is composed of a delay line and a matching circuit described in different embodiments. These delay circuits 45a to 45e are so constructed that the focal position thereof is controlled by a control signal $S_2$ from the control section 32 so that the focal position of ultrasonic wave becames moves towards a deeper place with the time. The concrete content of $S_2$ will be described in different embodiments.

Owing to the construction as described above, in the ultrasonic diagnostic apparatus in the present embodiment, since the different delay circuits 45a to 45e in the phasing circuit 47 can vary continuously the delay time by varying only the signal inputted in the control terminal thereof, it is possible to realize dynamic focussing, by which the focal point of ultrasonic beams moves continuously only by means of the phasing circuit 47 of one system.

Figure 1:
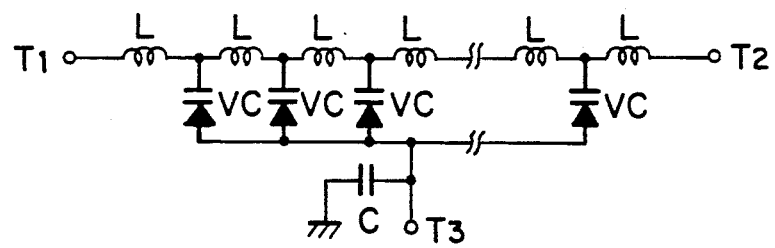
FIGS. 1 and 2 are schemes indicating delay lines using variable capacitance diodes related to the present invention.
Figure 2:
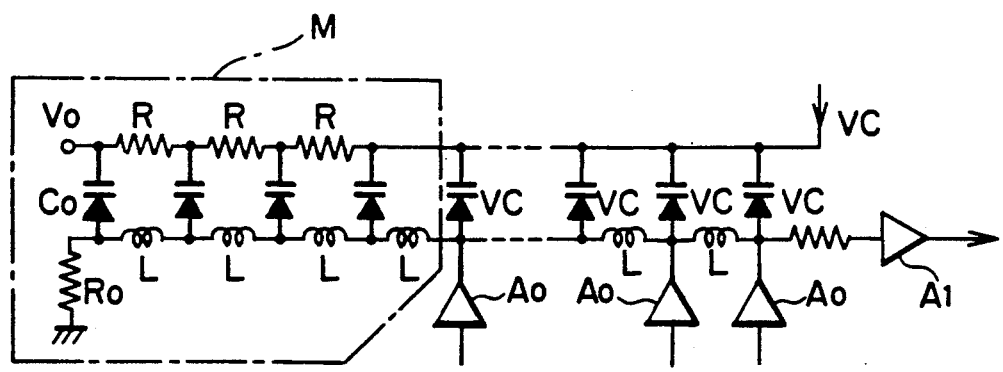
Figure 3:
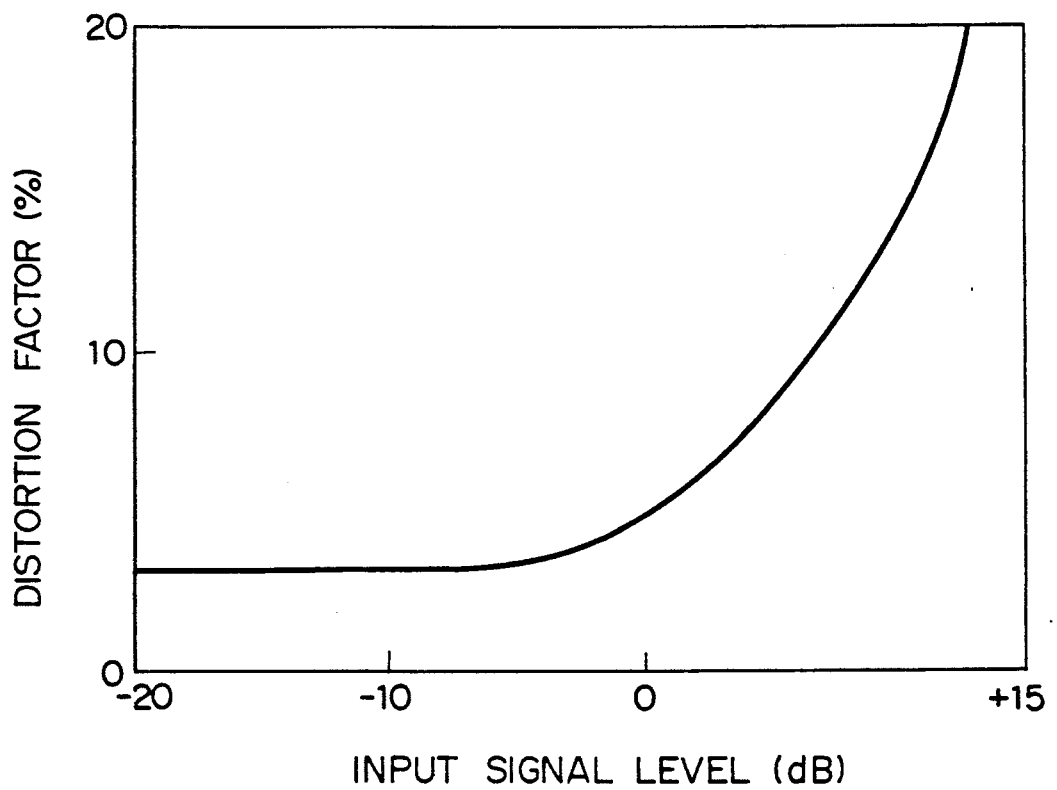
FIG. 3 is a graph indicating the relation between the level of the input signal and the distortion factor for the delay line indicated in FIG. 1.
Figure 4:
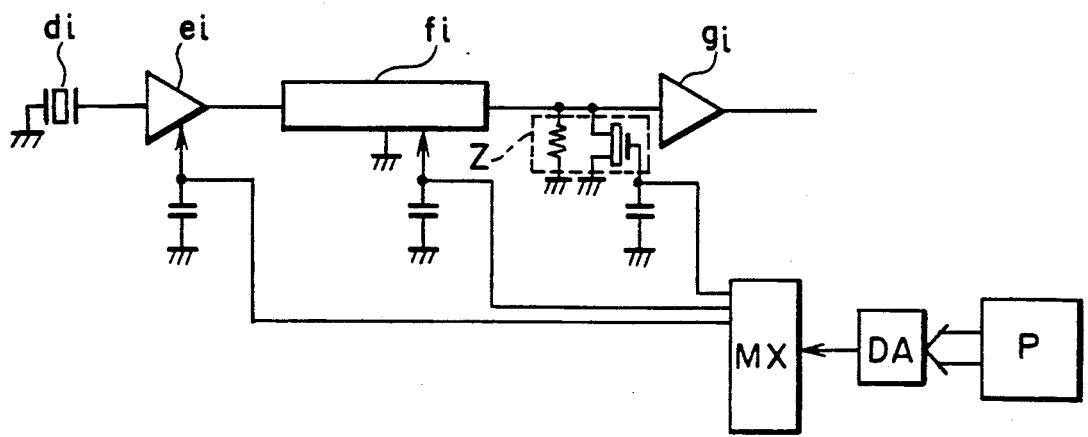
FIG. 4 is a scheme indicating a matching circuit using FETs related to the present invention.
Figure 8:
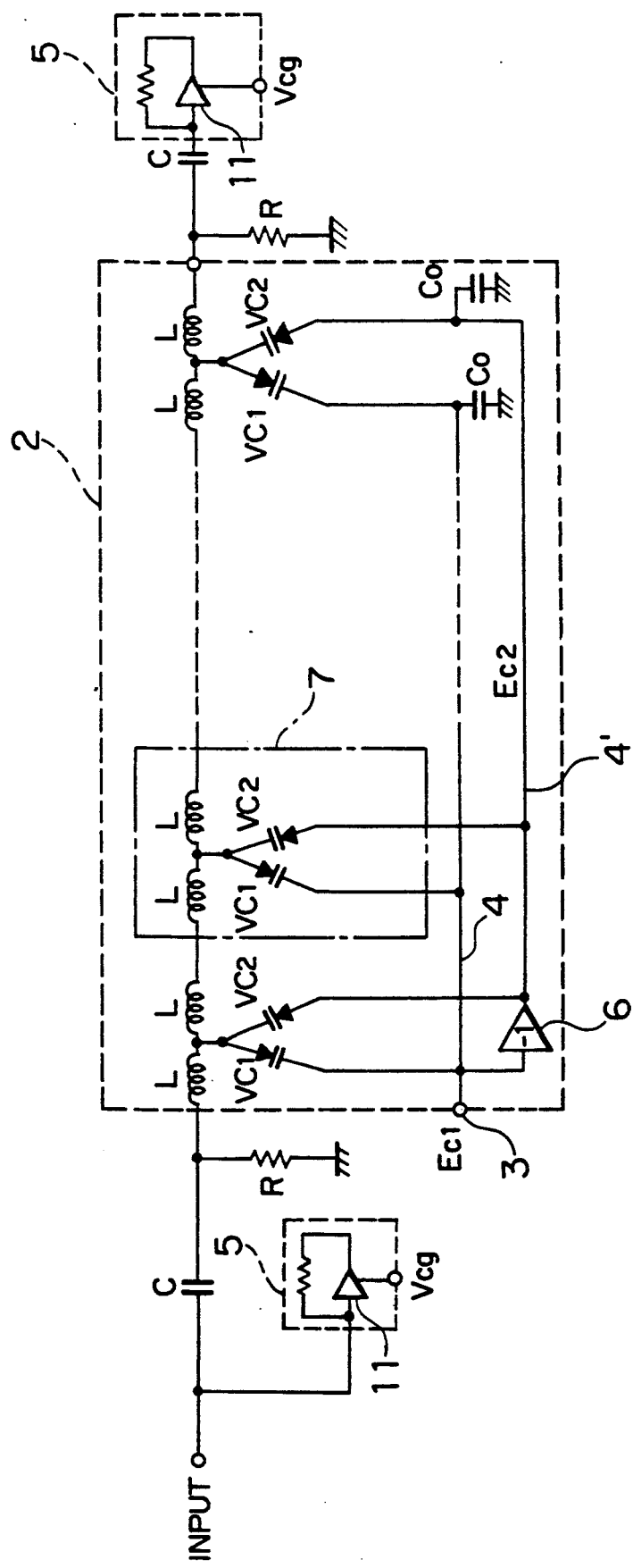
FIG. 8 is a scheme indicating an embodiment of the first delay line according to the present invention.

FIG. 8 is a circuit diagram indicating an embodiment of the first delay line 2 according to the present invention. This delay line 2 realizes a variable type delay line, by which the distortion factor of the output signal can be reduced with respect to a prior art variable type delay line (refer to FIG. 1). In the delay line consisting of a number of unit portions 1 connected in cascade, each unit portion including inductors L and a capacitor, as indicated in FIG. 8, a plurality of variable capacitance diodes, whose capacitance varies, depending on the magnitude of the reverse bias voltage, are divided into two groups, $VC_1$ and $VC_2$, and the capacitor of the unit portion is so constructed that a pair of variable capacitance diodes $VC_1$ and $VC_2$ are connected so that the phases of the high frequency signal voltage applied thereto are opposite to each other. In FIG. 8, the cathode of one variable capacitance diode $VC_1$ in the unit portion 7 and the anode of the other variable capacitance diode $VC_2$ are connected with the connecting point of the indactors L, L and the unit portion is so constructed that when the working point of the one variable capacitance diode $VC_1$ is moved by the high frequency signal voltage applied thereto so that the capacitance thereof increases, the other variable capacitance diode is operated so that the capacitance thereof decreases. In this way the unit portion is so constructed that variations in the capacitance are reduced as the whole of the combination of the two variable capacitance diodes $VC_1$ and $VC_2$. Further the cathode on the anode of the variable capacitance diodes $VC_1$ and $VC_2$ in a unit portion are connected with the cathode and the anode of the variable capacitance diodes $VC_1$ and $VC_2$ in each of the other unit portions, respectively, in common on opposite side of the inductor side and they are constructed together with control signal lines 4 and 4', through which reverse bias voltages $E_{c1}$ and $E_{c2}$ are applied to the variable capacitance diodes $VC_1$ and $VC_2$, respectively. The capacitance of the variable capacitance diodes are varied by these reverse bias voltages $E_{c1}$ and $E_{c2}$ so as to control the delay time. In addition, since $E_{c1}$ is a positive potential and $E_{c2}$ is a negative potential, an inverter amplifier 6 is disposed for obtaining $E_{c2}$ having a magnitude corresponding to $E_{c1}$.

Further, in FIG. 8, resistors R are those used for grounding the input terminal and the output terminal of the delay line 2 and act as a part of the signal source resistance and the terminating resistance, respectively, for the delay line 2 described above. The DC potential of the anode and the cathode of the variable capacitance diodes $VC_1$ and $VC_2$, respectively, in the different unit portion is kept equal to the ground level. Further a capacitor C is one for hindering DC and a capacitor $C_0$ is a bypass capacitor having a sufficiently great capacitance.

Figure 9:
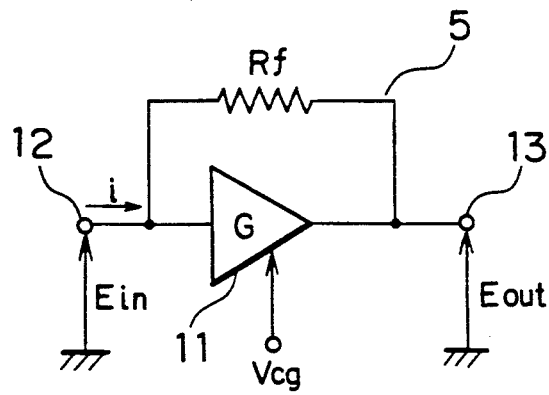
FIG. 9 is a scheme indicating an embodiment of the matching circuit according to the present invention.

Further, in the delay line 2 according to the invention, when the capacitance of the variable capacitance diodes $VC_1$ and $VC_2$ in the different unit portions is varied, depending on the magnitude of the reverse bias voltage applied thereto, the characteristic impedance thereof is varied together with the delay time. For this reason, it is necessary to vary the signal source resistance and the terminating resistance so as to match them always with the delay line 2 described above, corresponding to the control of the delay line. Therefore there are disposed variable resistance circuits 5, whose resistance is varied by electric signals, in the portions of the signal source resistance and the terminating resistance. The variable resistance circuit 5 can vary continuously the input resistance by varying the gain G of a variable gain amplifier 11 by means of a control voltage $V_{cg}$, as indicated in FIG. 9.

Hereinbelow the operation of the variable circuit 5 will be explained, referring to FIG. 9. The circuit indicated in FIG. 9 is so constructed that a variable gain amplifier 11, whose gain G can be controlled by a control voltage $V_{cg}$, is subjected to feedback through a constant resistor Rf so that the resistance of the circuit is variable. The variable gain amplifier 11 as described above can be realized by using a Gilbert cell, etc. widely utilized, for which there is a certain relationship between the control voltage $V_{cg}$ and the voltage gain G and variations in the gain G due to variations in the ambient temperature are small, which makes it practical. Now the impedance of the variable gain amplifier 11 viewed from the input terminal 12 will be obtained. At this time, supposing that the input impedance of the variable gain amplifier 11 is infinite and the output impedance is zero and denoting the input voltage and the current at the input terminal 12 b $E_{in}$ and i, respectively, and the output voltage at the output terminal 13 by $E_{out}$, following equations are valid:

$$E_{in} - Rf \cdot i - E_{out} = 0 \quad (1)$$

$$E_{out} = -G \cdot E_{in} \quad (2)$$

Eliminating $E_{out}$ from Eq (1) and Eq (2), $$E_{in} = \frac{Rf}{1+G} i \quad (3)$$

is obtained. Partially differentiating this equation representing the input voltage $E_{in}$ with respect to the current i, the impedance $Z_{in}$ viewed from the input terminal 12 is given by a following formula:

$$Z_{in} = \frac{\partial E_{in}}{\partial i} = \frac{Rf}{1+G} \quad (4)$$

When the gain G is varied in Eq. (4), the impedance $Z_{in}$ viewed from the input terminal 12 is varied. That is, the resistance between the input terminal 12 and the ground in the circuit indicated in FIG. 9 can be controlled by the control voltage $V_{cg}$. For example, when the gain is varied from 0 to 4, the impedance $Z_{in}$ at the input terminal varies from Rf to 0.2 Rf.

Figure 10:
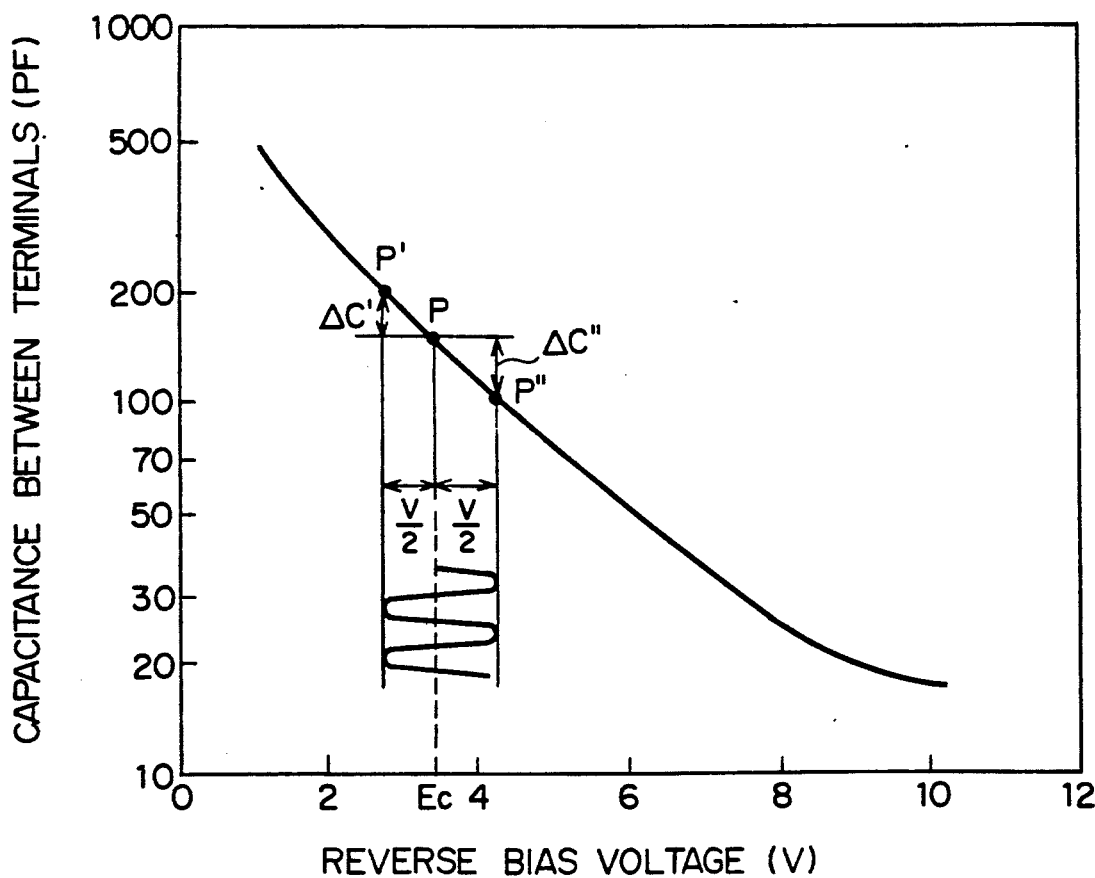
FIG. 10 is a scheme for explaining the operation of the delay line indicated in FIG. 8.

Next the operation of the delay line 2 thus constructed will be explained, using a static characteristic curve of the variable capacitance diode, as follows. FIG. 10 shows a characteristic curve of the variable capacitance diode. Here, when the voltage $E_{c1}$ is applied to the control terminal 3 in FIG. 8, as reverse bias voltages for the variable capacitance diodes $VC_1$, $VC_2$ described above, since the voltage $E_{c2}$ of polarity opposite to that of the voltage $E_{c1}$ is applied to the variable capacitance diode $V_{c2}$ by the inverter 6, the working point of the variable capacitance diodes $VC_1$ and $VC_2$ as a whole is at a point P on the static characteristic curve indicated in FIG. 10. Then a high frequency signal voltage is applied to the delay line 2. When the high frequency signal voltage having an amplitude V is applied to the variable capacitance diodes $VC_1$ and $VC_2$ in every unit portion, a high frequency signal voltage having an amplitude of V/2 is applied to each of the variable capacitance diodes $VC_1$ and $VC_2$ connected in directions opposite to each other. In this case, the working points of the variable capacitance diodes $VC_1$ and $VC_2$ are moved to points P' and PΔ or PΔ and P', respectively, in directions opposite to each other. Consequently, when the capacitance of one of the variable capacitance diodes, e.g. $VC_1$, is increased by ΔC', the capacitance of the other variable capacitance diode is decreased by ΔC''. The amount, by which the capacitance of the two variable capacitance diodes $VC_1$ and $VC_2$ connected in directions opposite to each other as a whole is varied, subjected to modulation by the high frequency signal voltage, is reduced with respect to the case where only one variable capacitance diode is used for every unit portion. As the result, in the variable type delay line 2 indicated in FIG. 8, since the variable capacitance diodes are not subjected to modulation due to the ultrasonic wave signal, waveform distortion of the high frequency signal is decreased.

Figure 11:
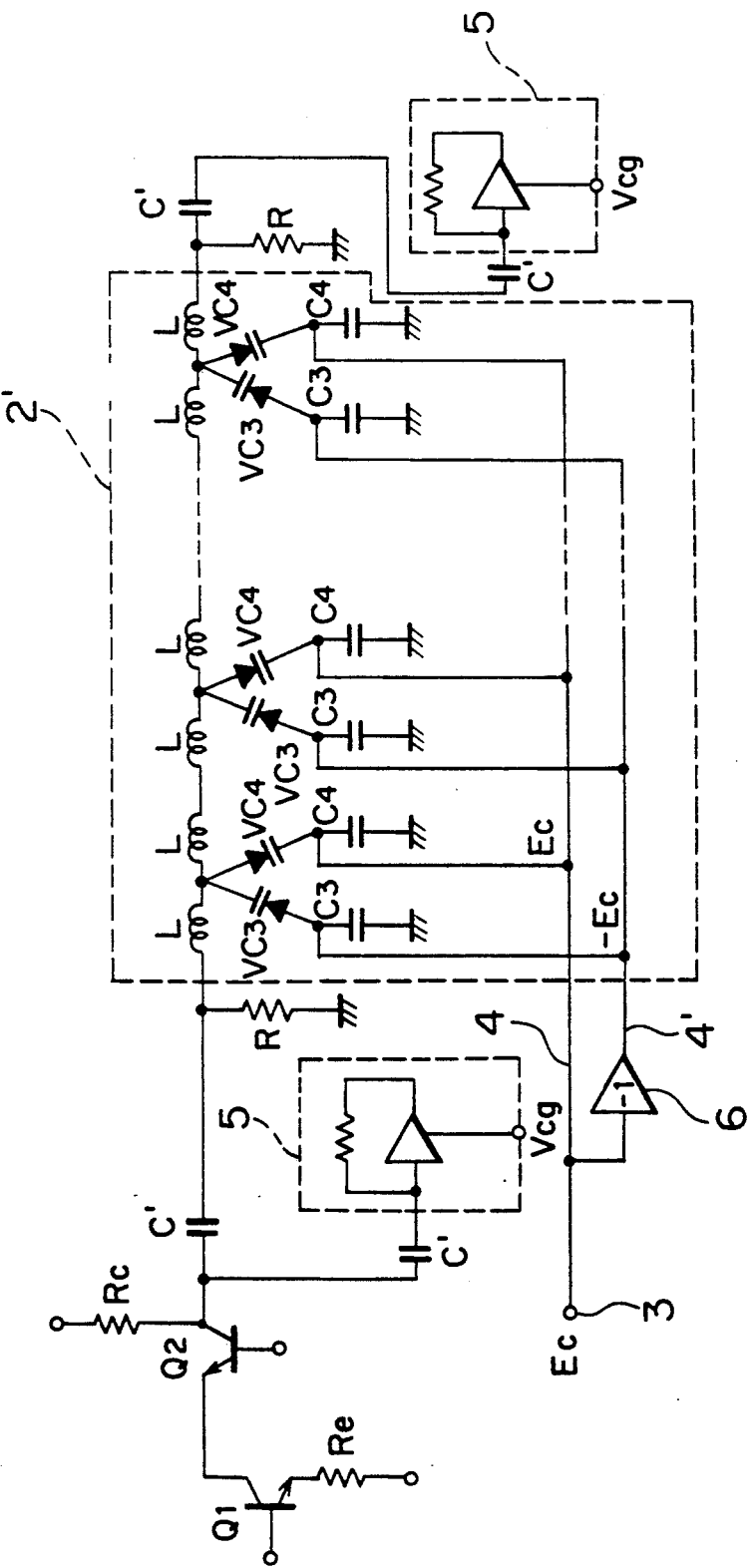
FIG. 11 is a scheme indicating another embodiment of the first delay line.

FIG. 11 shows another embodiment of the delay line 2 indicated in FIG. 8, in which in order to prevent worsening of the characteristics due to a high impedance of wiring, the anode and the cathode of the variable capacitance diode $VC_3$ and $VC_4$ are directly grounded through capacitances $C_3$ and $C_4$ disposed in the proximity of the variable capacitance diodes, respectively. In this case, the capacitances $C_3$ and $C_4$ described above have a sufficient great capacitance so that the impedance is satisfactorily low with respect to the high frequency signal voltage. In this way an effect can be obtained, which is identical to that obtained when one end of each of the two variable capacitance diodes $VC_3$ and $VC_4$ is directly grounded with respect to the high frequency signal.

In FIG. 11, a capacitance C' represents a coupling capacitor. This coupling capacitor C' is disposed in order that the DC potential determining the working point of the variable capacitance diodes $VC_3$ and $VC_4$ is not influenced by the signal source or the circuit at the terminal portion. Further a transistor $Q_1$ and a resistor $R_c$ constitutes a circuit converting the high frequency signal voltage into current, which is constructed so as to drive a delay line 2' as a constant current source together with a base-grounded circuit consisting of another transistor $Q_2$ and a resistor $R_c$.

Next the second delay line according to the present invention will be explained.

Figure 12:
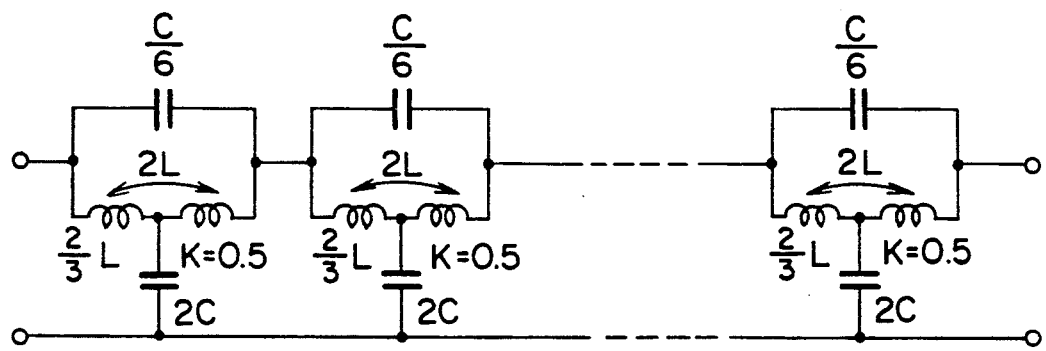
FIG. 12 is a scheme indicating a second order all pass type delay line.

In the second delay line, capacitors in a second order all pass type delay line consisting of concentrated constant inductors and capacitors indicated in FIG. 12 are constituted by variable capacitance diodes. By using a second order all pass type delay line it is possible to intend to improve delay time-frequency characteristics.

Figure 13:
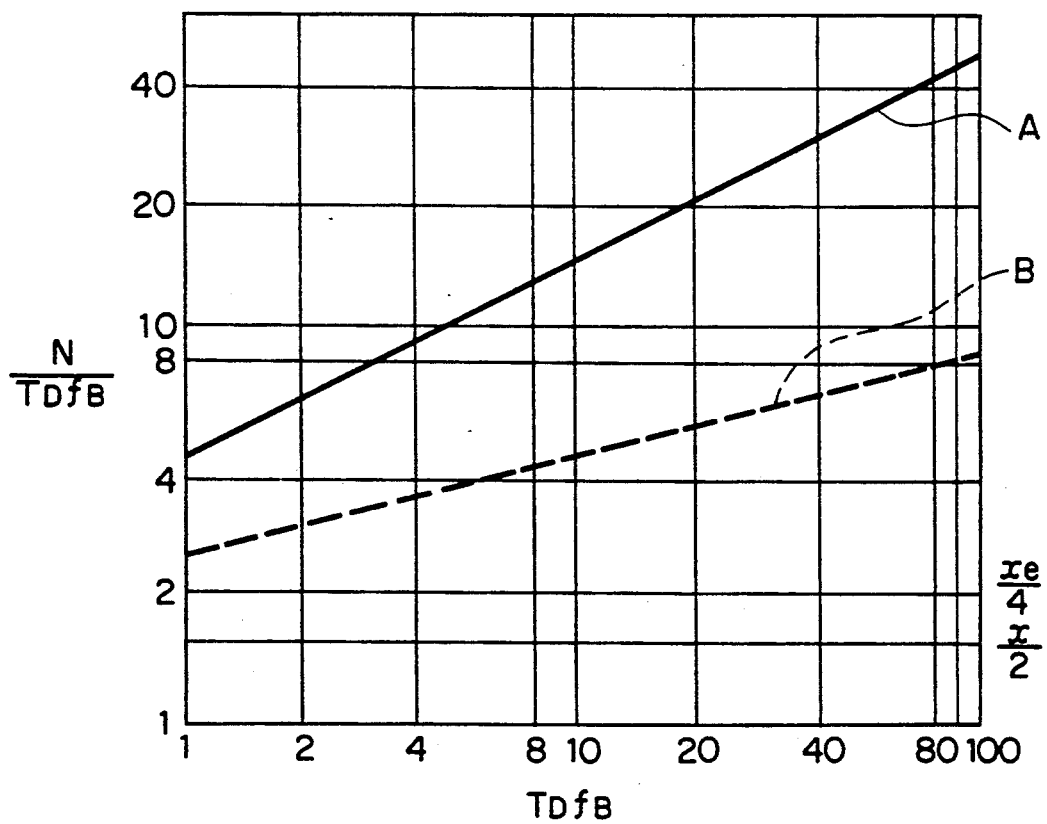
FIG. 13 is a graph showing characteristics of an inductive M type delay line and the second order all pass type delay line.

In the inductive M type delay line indicated in FIGS. 6A and 6B and the second order all pass type delay line, the relation between the delay-band width product $T_Df_B$, which is a product of the delay time $T_D$ by the frequency band width $f_B$, and $N/T_Df_B$ representing the number of unit portions N required for every unit delay-band width product $T_Df_B$ is indicated in FIG. 13 ("NHK Monthly Report", Sho 43, 5, p. 25). In FIG. 13, a full line A corresponds to the case of the inductive M type delay line and a broken line B to the case of the second order all pass type delay line. From this FIG. 13 it can be understood that the required number of unit portions is smaller for the second order all pass type delay line than for the induced M type delay line for a same delay-band width product $T_Df_B$. Therefore the size of the delay line can be made smaller and also signal transmission loss can be reduced.

Figure 14:
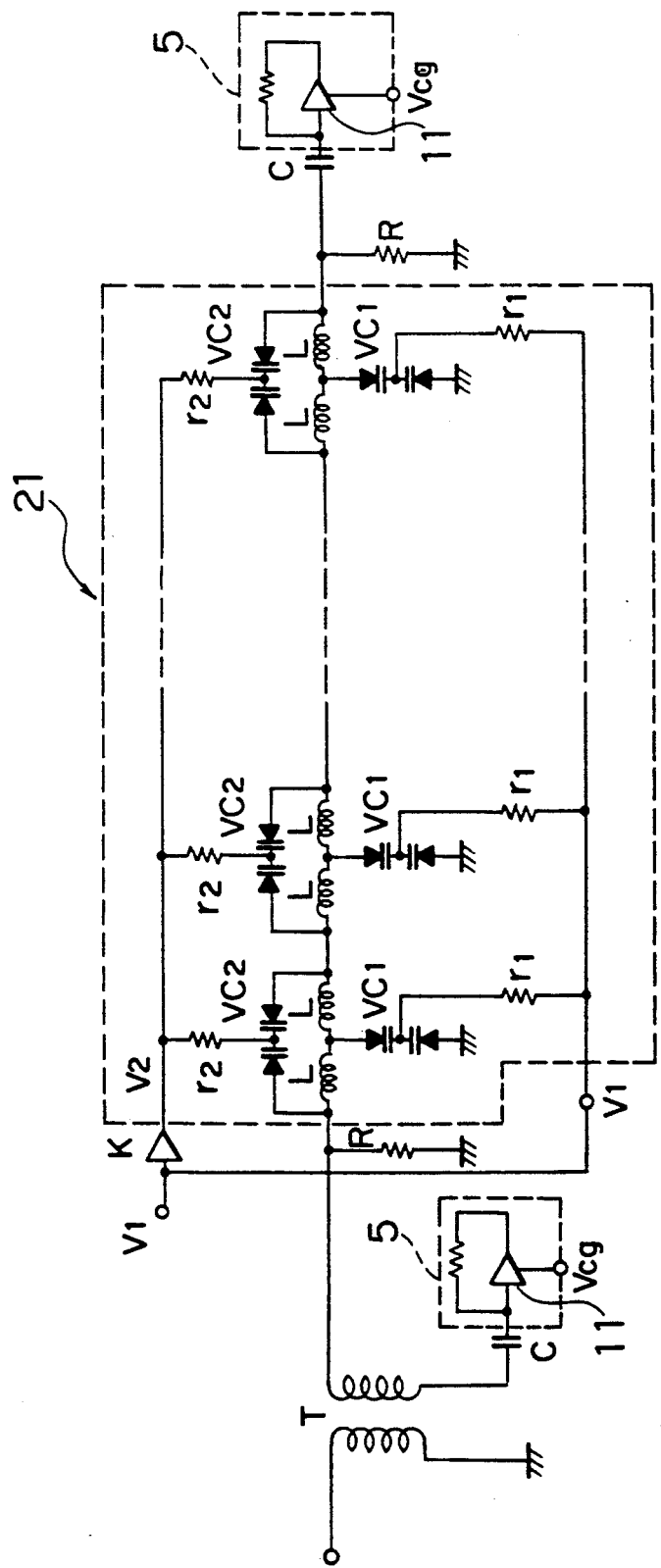
FIG. 14 is a scheme indicating the second delay line according to the present invention.

FIG. 14 shows an embodiment of the second delay line. In the delay line indicated in FIG. 14, the part corresponding to one of the capacitors 2C is constructed by variable capacitor diodes $VC_1$ and the part corresponding to the other capacitor C/6 is constructed by other variable capacitor diodes $VC_2$. The variable capacitance diodes $VC_1$ and $VC_2$ are controlled by control voltages $V_1$ and $V_2$ applied thereto through resistors $r_1$ and $r_2$, respectively. These resistors $r_1$ and $r_2$ are disposed for the purpose of preventing that signals flow through different unit portions controlling the capacitance of the variable capacitance diodes $VC_1$ and $VC_2$ described above and that the signals in different unit portions interfere with each other.

The one of the variable capacitance diodes $VC_1$ varies the capacitance by varying the control voltage $V_1$ to control the delay time of the delay line 21. At this time, in order to keep good frequency characteristics of the delay time, it is necessary that the capacitance of the other variable capacitance diode $VC_2$ is kept to be equal to 1/12 of the capacitance of the one of the variable capacitance diodes $VC_1$. Consequently the control voltages $V_1$ and $V_2$ may be given so as to satisfy such an operation condition. In this case, if the variable capacitance diodes $VC_1$ and $VC_2$ are in a relation that characteristic curves there of representing the relation between the reverse bias voltage and the capacitance are described by a same function, i.e. if two variable capacitance diodes having almost equal ratios of variations in the capacitance with respect to variations in the reverse bias voltage applied thereto are used, the delay line can be constructed simply by using a same signal source voltage, e.g. $V_1$, as indicated in FIG. 14, which is supplied directly to the variable capacitance diode $VC_1$ and by supplying $V_2$ obtained by dividing it by means of a coefficient generator K to the variable capacitance diode $VC_2$.

Figure 15:
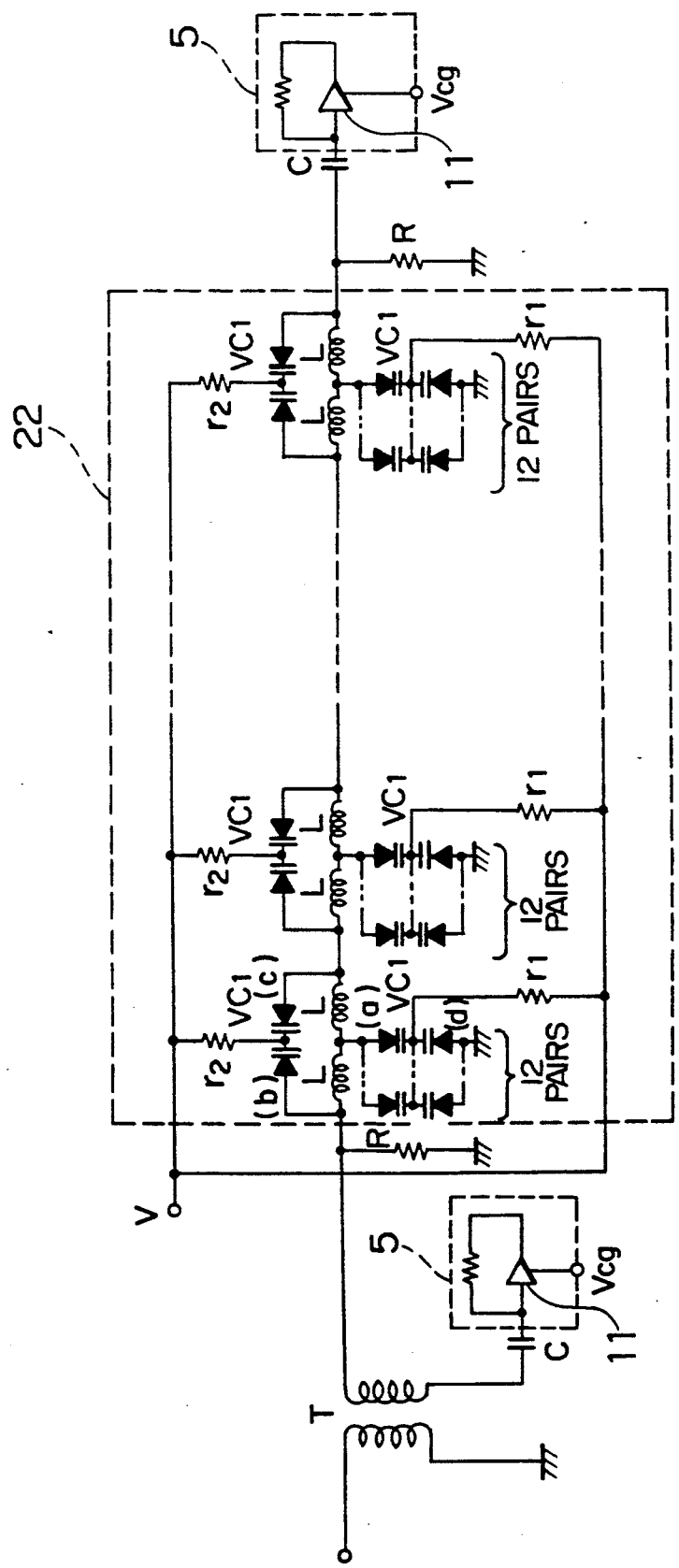
FIGS. 15 and 16 are schemes indicating other embodiments of the second delay line.
Figure 16:
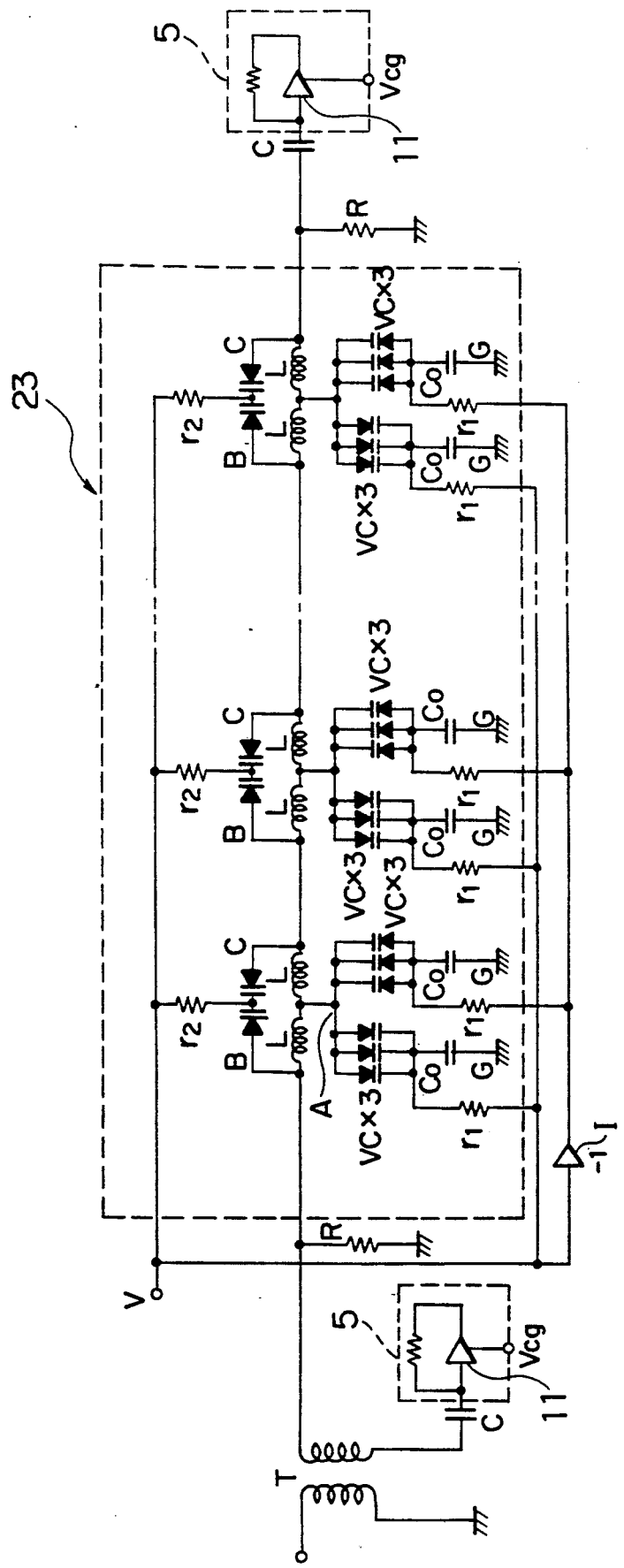

In FIG. 14, in order that the variable capacitance diodes $VC_1$ and $VC_2$ have a same characteristic curve representing the relation between the reverse bias voltage and the capacitance and that the capacitance of $VC_2$ is always equal to 1/12 of that of $VC_1$ for a same reverse bias voltage, it is sufficient to use different numbers of variable capacitance diodes of same kind connected in parallel for $VC_1$ and $VC_2$. Such embodiments are indicated in FIGS. 15 and 16. In FIG. 15, 12 pairs of variable capacitance diodes, whose cathodes are connected in common, are used for the part corresponding to the variable capacitance diode $VC_1$ in each of the unit portion in FIG. 14 and one pair of variable capacitance diodes, whose cathodes are connected in common, are used for the part corresponding to the variable capacitance diode $VC_2$ in FIG. 14. Owing to such a construction, only by varying the delay time control signal V of one system, the capacitance between points (b) and (c) is equal to 1/12 of the capacitance between points (a) and (d) and thus it is possible to achieve the optimum delay characteristics.

In the embodiment indicated in FIG. 16, supposing that all the variable capacitance diodes are of same kind and that each of them corresponds to one variable capacitance diode $VC_1$ in FIG. 14, two sets (the total capacitance thereof being 6C) are prepared, each of which consists of 3 variable capacitance diodes VC connected in parallel, each of them having a capacitance C. These two sets of variable capacitance diodes are connected at their anodes and cathodes, respectively, at a point A and constructed so that control voltages having polarities opposite to each other are applied thereto through resistors $r_1$, respectively, in order to apply reverse bias voltages having a same absolute value thereto. In this case, a bypass capacitor $C_0$ having a capacitance sufficiently greater than the sum of the capacitances of the two sets, each of which consists of 3 variable capacitance diodes, so that they are at the ground potential with respect to the high frequency signal. In order to give the two sets of variable capacitance diodes described above reverse bias voltages having a same absolute value and polarities opposite to each other, there is disposed an inverter I consisting of an operational amplifier. The capacitance ($\frac{1}{2}$C) between points B and C in the two variable capacitance diodes connected in series is equal to 1/12 C of the capacitance between points A and G. Since such a condition is satisfied regardless of the magnitude of the control voltage V, the optimum delay characteristics can be achieved.

The size of the delay line is reduced and the aimed effect can be easily achieved, if variable capacitance diodes having a same structure are formed on a same silicon substrate and elements, for which necessary mutual wiring is performed, are used as the variable capacitance diodes in the different unit portions of the variable delay lines indicated in FIGS. 15 and 16 in order to make the elements closest.

Further, in FIGS. 14, 15 and 16, a symbol R represents a resistor for equalizing one of the DC potentials applied to the variable capacitance diodes to the ground potential and constitutes a part of the signal source resistor or the terminating resistor of the delay line, which is connected in parallel with an electronically controlled variable resistor 5. Furthermore a symbol C represents a capacitor for hindering DC current. In addition, a symbol T represents a high frequency transformer. One end of the secondary winding is connected with the electronically controlled variable resistor 5 through the capacitor C and the other end is connected with the delay line 21, 22, 23. Consequently the delay line 21, 22, 23 described above is driven by a constant voltage signal source having a signal source resistance determined by the electronically controlled variable resistor 5.

Figure 17:
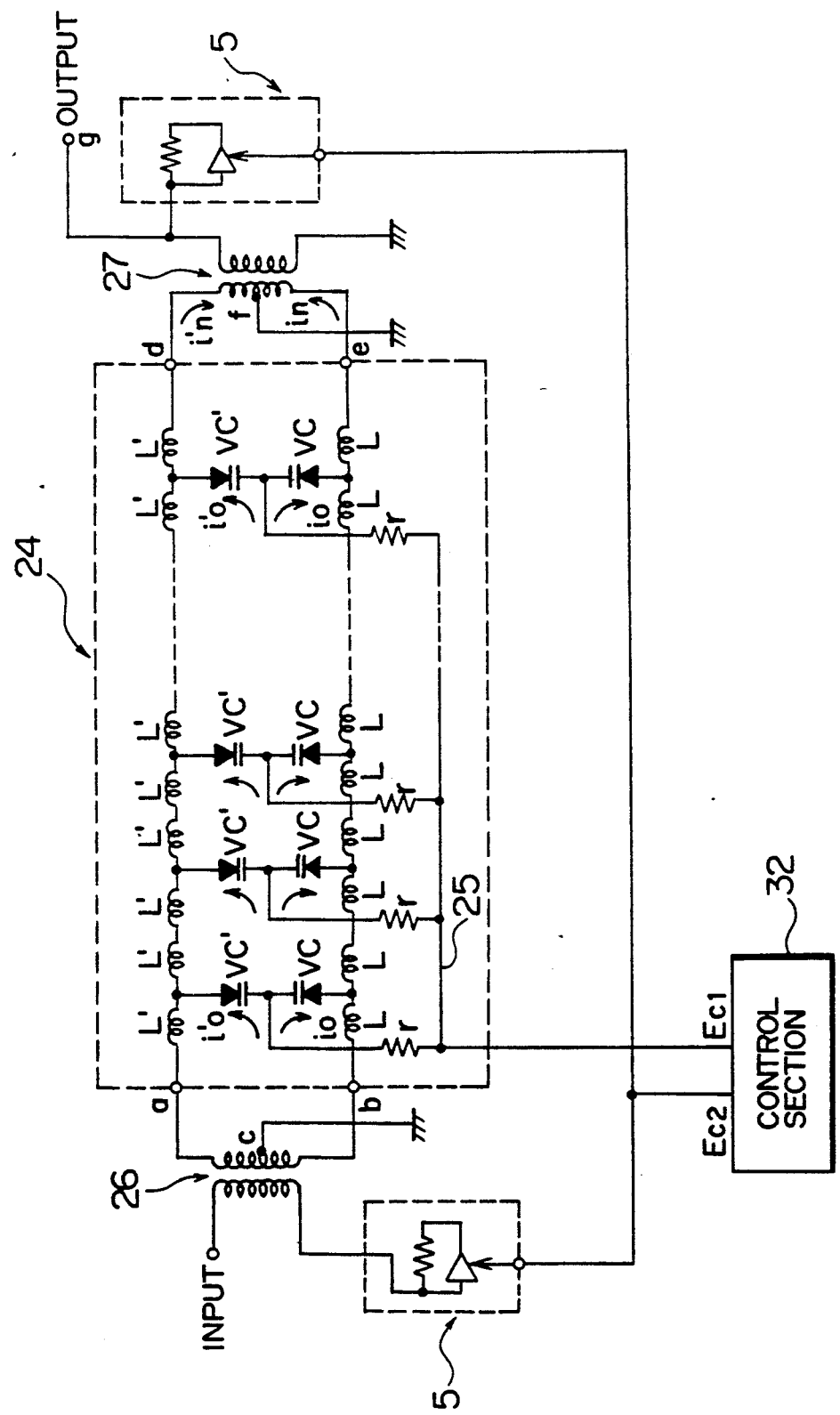
FIG. 17 is a scheme indicating the third delay line according to the present invention.

FIG. 17 indicates are embodiment of the third delay line, by which it is prevented that noise components produced by electric signals for controlling the variable capacitance diodes are superimposed in the ultrasonic signal.

In the present embodiments, the capacitor C in a lamped type delay line consisting a number of unit portions indicated in FIGS. 6A and 6B connected in cascade is constructed by variable capacitance diodes, whose capacitance varies, depending on the magnitude of the reverse bias voltage and at the same time each of the unit portions is constructed in a balanced type circuit by using inductors and variable capacitance diodes.

The variable delay line 24 consists of a number of unit portions connected in cascade, each of which is constructed in a balanced type circuit by connecting a T type symmetrical circuit obtained by connecting two inductors L, L and one variable capacitance diode VC with another T type symmetrical circuit obtained by connecting two other inductors L', L' and one variable capacitance diode VC', the cathodes of the respective variable capacitance diodes VC and VC' being connected in common. A control voltage $E_{cl}$ is applied through a respective resistor r by a control section 32 to the place where the cathodes of the respective variable capacitance diodes VC and VC' are connected in common, and the delay time is controlled by varying the capacitance by the reverse bias voltage using this $E_{cl}$. Further, the resistor r described above is disposed for the purpose of preventing that signals flow to the variable capacitance diodes VC and VC' in the different unit portions through a control signal line 25 and give rise to interferences between the variable capacitance diodes VC and VC'.

The signal source resistor and the terminating resistor of this variable delay line 24 are constructed by using variable resistance circuits 5, in each of which the resistance of the circuit is made variable by subjecting an amplifier, whose gain can be controlled by an electric signal, to feedback through a constant resistance.

Further the input terminals a, b and the output terminals d, e of the variable delay line 24 described above are connected with the high frequency transformers 26 and 27, provided with intermediate taps c and f on one of the windings thereof respectively, both of the intermediate taps c and f described above being grounded. Consequently, if characteristics of the variable capacitance diodes VC and VC' in the different unit portions are identical, a same reverse bias voltage for controlling the capacitance of the variable capacitance diodes VC and VC' is applied uniformly to all the variable capacitance diodes VC and VC' through the control signal line 25 and the respective resistors r.

In the delaying circuit constructed as indicated in FIG. 17 described above, since currents $i_o$ and $i'_o$ flowing in he variable delay line 24 through the variable capacitance diodes VC and VC' in the different unit portions by the high frequency component in the control voltage $E_{cl}$ from the control section 32 are identical, currents $i_n$ and $i'_n$ appearing at the output terminals d and e of the variable delay line 24 are also identical to each other. These output currents $i_n$ and $i'_n$ flow in the high frequency transformer 27 on the output side, as indicated in the figure, and flow to the ground line through the intermediate tap f thereof, but they don't appear at the output terminal g of the delay line, compensated by each other in the high frequency transformer 27 described above. That is, the control signal component for controlling the delay time and noise components superimposed in the control signal line 25 by induction don't appear at the output terminal of the variable delay line 24 and thus the S/N ratio in the delay line can be improved.

Figure 18:
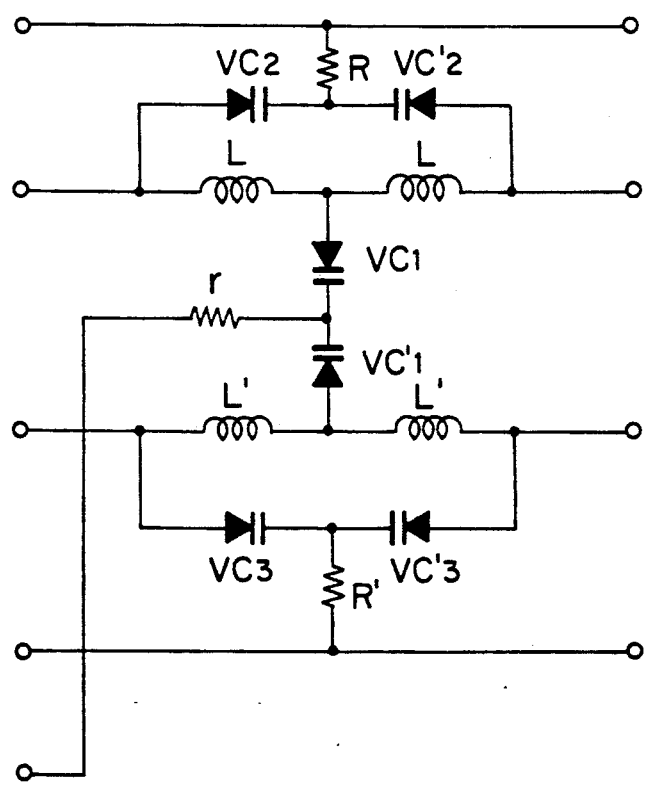
FIG. 18 is a scheme indicating another embodiment of the third delay line.

Although in the variable delay line 24 in the delaying circuit indicated in FIG. 17, it is supposed that the unit portion is constructed in a balanced type circuit on the basis of the inductive m type low pass filter indicated in FIG. 6B, it is not restricted thereto, but it may be constructed by a number of unit portions connected in cascade, each of the unit portions being constructed in the balanced type circuit on the basis of the second order all pass type filter consisting of inductors L, L', variable capacitance diodes $VC_1$, $VC_1'$, $VC_2$, $VC_2'$, $VC_3$, $VC_3'$, and resistors R, R' having identical characteristics, respectively, which are combined with each other, as indicated in FIG. 18. By using a variable delay line thus constructed it is possible to improve similarly the property of preventing mixing of the noise components.

As another embodiment it may be so constructed that voltages V and −V are applied to the input terminals a and b, respectively, without using the transformer 26.

Figure 19:
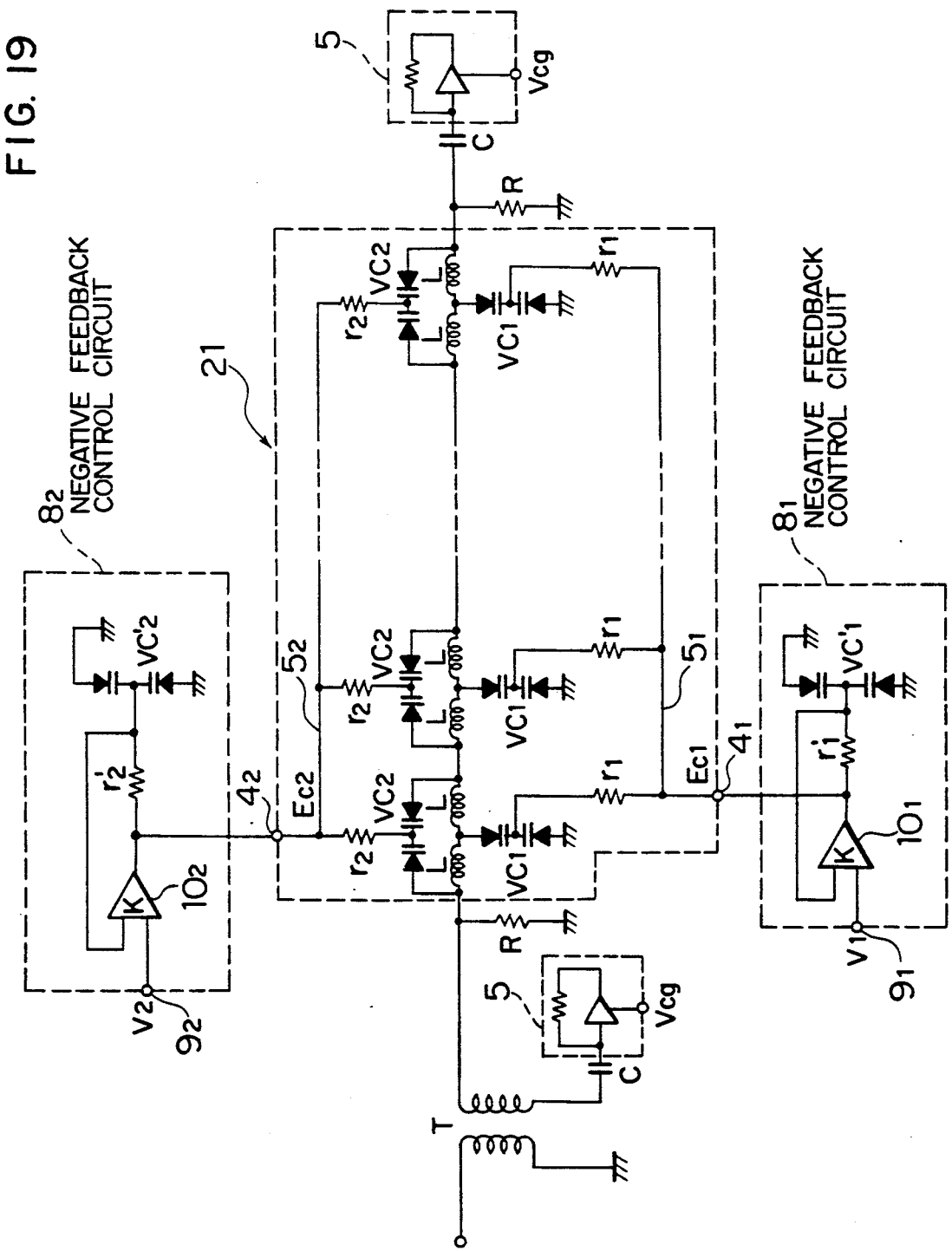
FIG. 19 is a scheme indicating the fourth delay line according to the present invention.

FIG. 19 indicates the fourth delay line, by which the rise time of the reverse bias voltage applied to the variable capacitance diodes is shortened so that the speed of controlling the delay time is increased.

Now the fourth delay line will be explained, taking the delay line indicated in FIG. 14 as an example.

In the delay line indicated in FIG. 14, when the resistances $r_1$ and $r_2$ connected with the variable capacitance diodes $VC_1$ and $VC_2$, respectively, are increased in order to reduce interference between the different unit portions and at the same time to decrease the loss of transmission of signals, the time constants of the group of $r_1$ and $VC_1$ and the group of $r_2$ and $VC_2$ increase, which worsens control characteristics for controlling the delay time of the variable type delay line 21 by means of the control voltages $V_1$ and $V_2$. That is, a problem is produced that the voltages applied to the variable capacitance diodes $VC_1$ and $VC_2$ don't vary rapidly, corresponding to variations in the control voltages $V_1$ and $V_2$ with the lapse of time.

Therefore the present embodiment solves such a problem so that the delay time can be controlled by an electric signal and at the same time the speed of the control of the delay time is increased.

The feature of the present embodiment is that negative feedback control circuits $8_1$ and $8_2$ are connected with control terminals $4_1$ and $4_2$, as indicated in FIG. 19. These negative feedback control circuits $8_1$ and $8_2$ take-in the reverse bias voltages $E_{c1}$ and $E_{c2}$ applied to the variable capacitance diodes $VC_1$ and $VC_2$ constituting each of the unit portions through a resistor to detect it; amplify difference voltages obtained by comparing the reverse bias voltages with reference voltages $V_1$ and $V_2$ for controlling them; and apply the voltages thus obtained to the variable capacitance diodes $VC_1$ and $VC_2$ in the respective unit portion as the reverse bias voltages. That is, a first negative feedback control circuit $8_1$ consists of variable capacitance diodes $VC_1'$, in which two variable capacitance diode elements whose cathodes are connected in common, form a pair, similarly to those constituting the unit portion in the delay line 21; the reverse bias voltage $E_{c1}$ applied to these variable capacitance diodes $VC_1'$; and an operational amplifier 10 amplifying the difference voltages between this reverse bias voltage and the reference voltage $V_1$ from an input terminal $9_1$. In this way it is so constructed that the reverse bias voltage $E_{c1}$ is applied from the operational amplifier $10_1$ to the variable capacitance diodes $VC_1'$ through a resistor $r_1'$ and that the output voltage from the operational amplifier $10_1$ is supplied to the first variable capacitance diodes $VC_1$ in each of the unit portions through the control terminal $4_1$ described above. Similarly to that described above, a second negative feedback control circuit $8_2$ consists of variable capacitance diodes $VC_2'$, a resistor $r_2'$ and an operational amplifier $10_2$ and it is so constructed that the output voltage from this operational amplifier $10_2$ is supplied to the second variable capacitance diodes $VC_2$ in each of the unit portions through the control terminal $4_2$ described above.

In the negative feedback control circuits $8_1$ and $8_2$ thus constructed, e.g. in the first negative feedback control circuit $8_1$, when the gain K of the operational amplifier $10_1$ is sufficiently large, the voltage $(V_1 - E_{c1})$ K obtained by amplifying the difference voltage $(V_1 - E_{c1})$ between the reference voltage $V_1$ and the detected reverse bias voltage $E_{c1}$ satisfies at first;

$$(V_1 - E_{c1})K > V_1$$

In this case, the reference voltage $V_1$ is applied directly to the first variable capacitance diodes $VC_1$ in each of the unit portions through the resistor $r_1$ and charges rapidly the first variable capacitance diodes $VC_1$ described above. In this way the potential of the first variable capacitance diodes $VC_1$ reaches a stationary value in a short time. At this time, since all the first variable capacitance diodes $VC_1$, $VC_1$, ... in the different unit portions constituting the delay line 21 are connected through the control signal line $5_1$, the voltage $(V_1 - E_{c1})$ K described above is applied uniformly to all the variable capacitance diodes $VC_1$ through the control signal line $5_1$ and thus the potential thereof reaches the stationary value in a short time.

Figure 20:
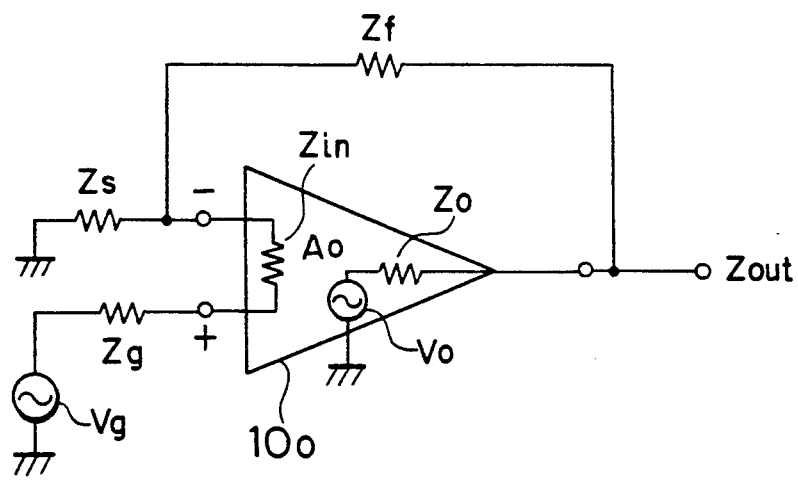
FIG. 20 is a scheme indicating the working principle of the delay line indicated in FIG. 19.

In order to explain further quantitatively that described above, the operation thereof will be described, referring to an operational amplifier $10_0$ having a general circuit form indicated in FIG. 20. The output impedance $Z_{out}$ of the operational amplifier $10_0$ indicated in FIG. 20 is given by a following formula, as described in "IC operational amplifier and its applications (in Japanese)" (Nikkan Kogyo Shinbun-sha (Daily Industrial Newspaper Co.), May 1975) p. 182;

$$Z_{out} = \frac{Z_0 \cdot F}{A_0} \quad (5)$$

where $A_0$ represents the gain of the operational amplifier $10_0$ and F is a value given by a following formula;

$$F = \left(1 + \frac{Z_g}{Z_{in}}\right)\left(1 + \frac{Z_f}{Z_s}\right) + \frac{Z_f}{Z_{in}} \quad (6)$$

In the first negative feedback control circuit $8_1$ indicated in FIG. 19, concerning impedances $Z_s$ and $Z_f$ indicated in FIG. 20, $Z_s > 1$ and $Z_f = 0$ are valid. Further, if the signal source inpedance $Z_g$ is satisfactorily small and the input impedance $Z_{in}$ of the operational amplifier is sufficiently great, since $$Z = 0, \quad \frac{Z_f}{Z_{in}} = 0,$$

F=1 in obtained from Eq. (6). In this case, from Eq. (5)

$$Z_{out} = \frac{Z_0}{A_0} \quad (7)$$

is obtained.

Figure 21:
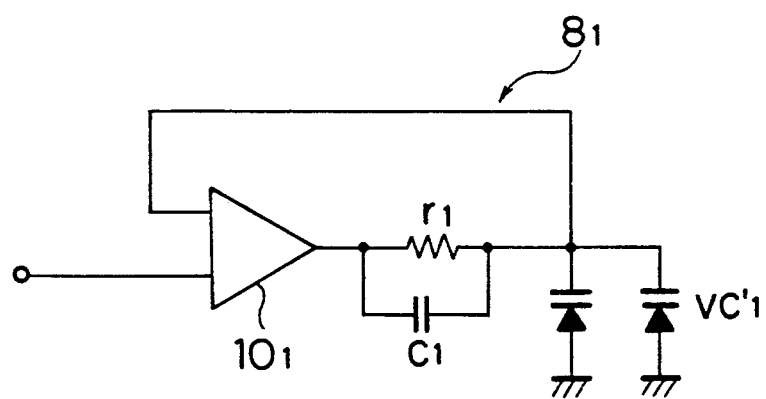
FIG. 21 is an equivalent circuit diagram of the delay line indicated in FIG. 20 under specified conditions.

In such a state, replacing the circuit indicated in FIG. 20 by a simple equivalent circuit indicated in FIG. 21, which is used as the negative feedback circuit $8_1$ and supposing that the output impedance of the operational amplifier $10_1$ sufficiently small, $Z_0$ in Eq. (7) described previously can be put to be $r_1$. Consequently $$Z_{out} = \frac{r_1}{A_0} \quad (8)$$

is obtained. From this Eq. (8), it can be understood that in the negative feedback control circuit $8_1$ indicated in FIG. 21, this corresponds to the fact that the variable capacitance diode VC$_1'$ is charged through a sufficiently small resistance r$_1$/A$_0$, depending on the magnitude of the gains A$_0$ of the operational amplifier 10$_1$, the coefficient at this time being 1/A$_0$. Further, in this negative feedback control circuit 8$_1$, a phase compensating circuit is necessary for preventing oscillation, taking characteristics of the operational amplifier 10$_1$ into account. A circuit, in which a compensating capacitor C$_1$ is disposed is indicated in FIG. 21 as an example thereof.

Although, in the above, the operation, etc. of the first negative feedback control circuit 8$_1$ have been explained, the second negative feedback control circuit 8$_2$ controlling the reverse bias voltage applied to the second variable capacitance diodes VC$_2$ constituting the unit portion indicated in FIG. 19 performs a completely identical operation.

Figure 22:
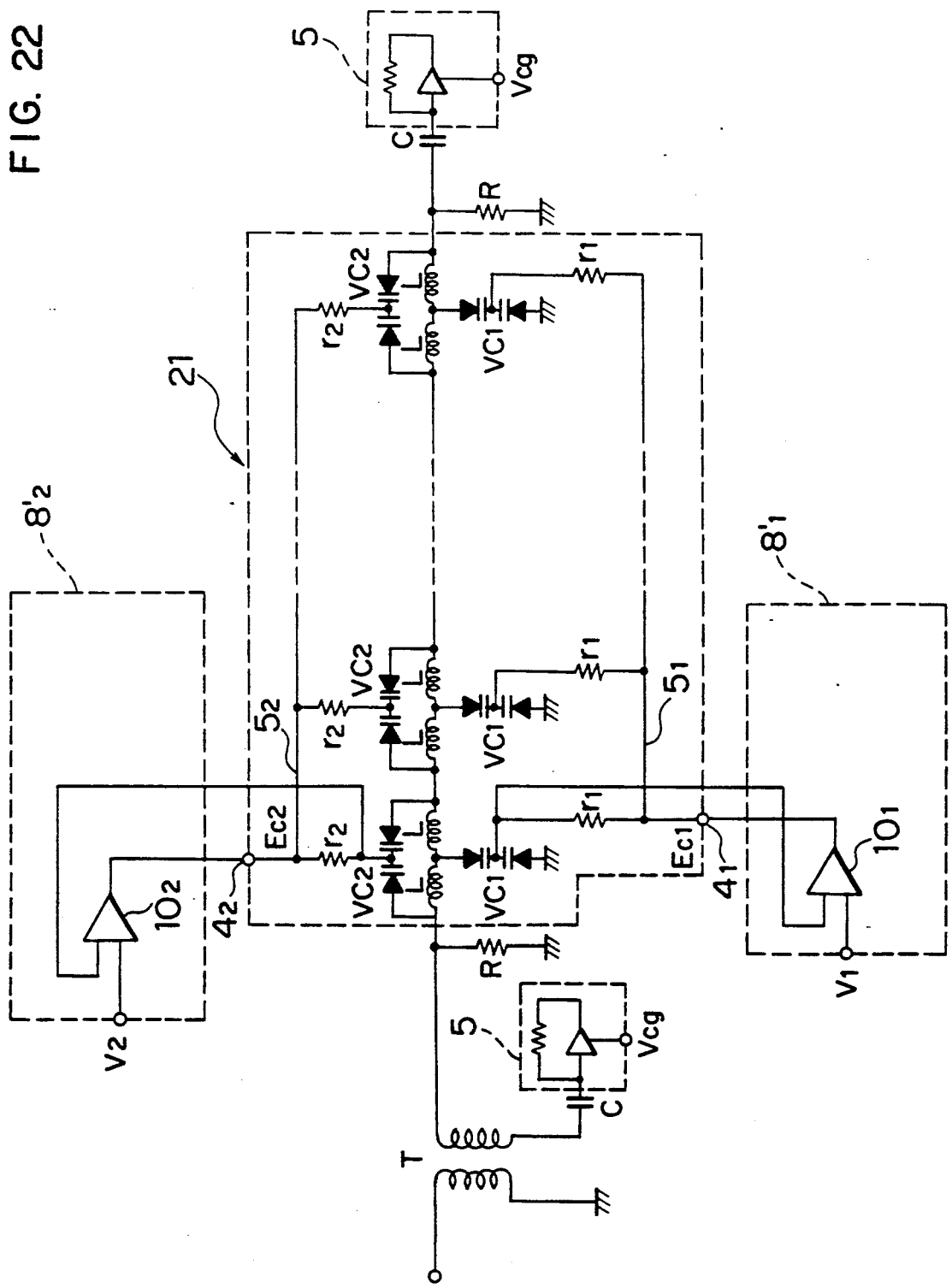
FIG. 22 is a scheme indicating another embodiment of the fourth delay line according to the present invention.

FIG. 22 is a circuit diagram indicating a second embodiment of the fourth delay line. This embodiment is so constructed that, in the first and the second negative feedback control circuit 8$_1$ and 8$_2$ in FIG. 19, the variable capacitance diodes VC$_1'$, VC$_2'$ as well as the resistors r$_1'$, r$_2'$ are not disposed separately, but the reverse bias voltages applied to the variable capacitance diodes VC$_1$, VC$_2$ in each of the unit portions constituting the delay line 21 are taken directly in the operational amplifiers 10$_1$, 10$_2$, which are compared with the reference voltages V$_1$ and V$_2$, the difference voltages being amplified, and the voltages thus obtained are applied to the variable capacitance diodes VC$_1$ and VC$_2$ in each of the unit portions as the reverse bias voltages.

In this case, together with the reverse bias voltages applied to the variable capacitance diodes VC$_1$ and VC$_2$ in the different unit portions, the signal voltages on the delay line 21 superposed thereon are inputted in the operational amplifiers 10$_1$ and 10$_2$, respectively. Here, if the response frequency bands of the operational amplifiers 10$_1$ and 10$_2$ extend sufficiently upto the signal frequency of the delay line 21 and they have a sufficiently high gain even in such a high frequency band, the impedances of the operational amplifiers 10$_1$ and 10$_2$ viewed from the cathodes of the variable capacitance diodes VC$_1$ and VC$_2$ are sufficiently low in spite of the existence of the resistors r$_1$ and r$_2$, respectively, which can cause worsening of the characteristics of the delay line 21. In order to prevent these phenomena, it is preferable to use amplifiers having a narrow band for the operational amplifiers 10$_1$ and 10$_2$ or to limit the band of the operational amplifiers 10$_1$ and 10$_2$ described above by means of filters, etc.

Figure 23:
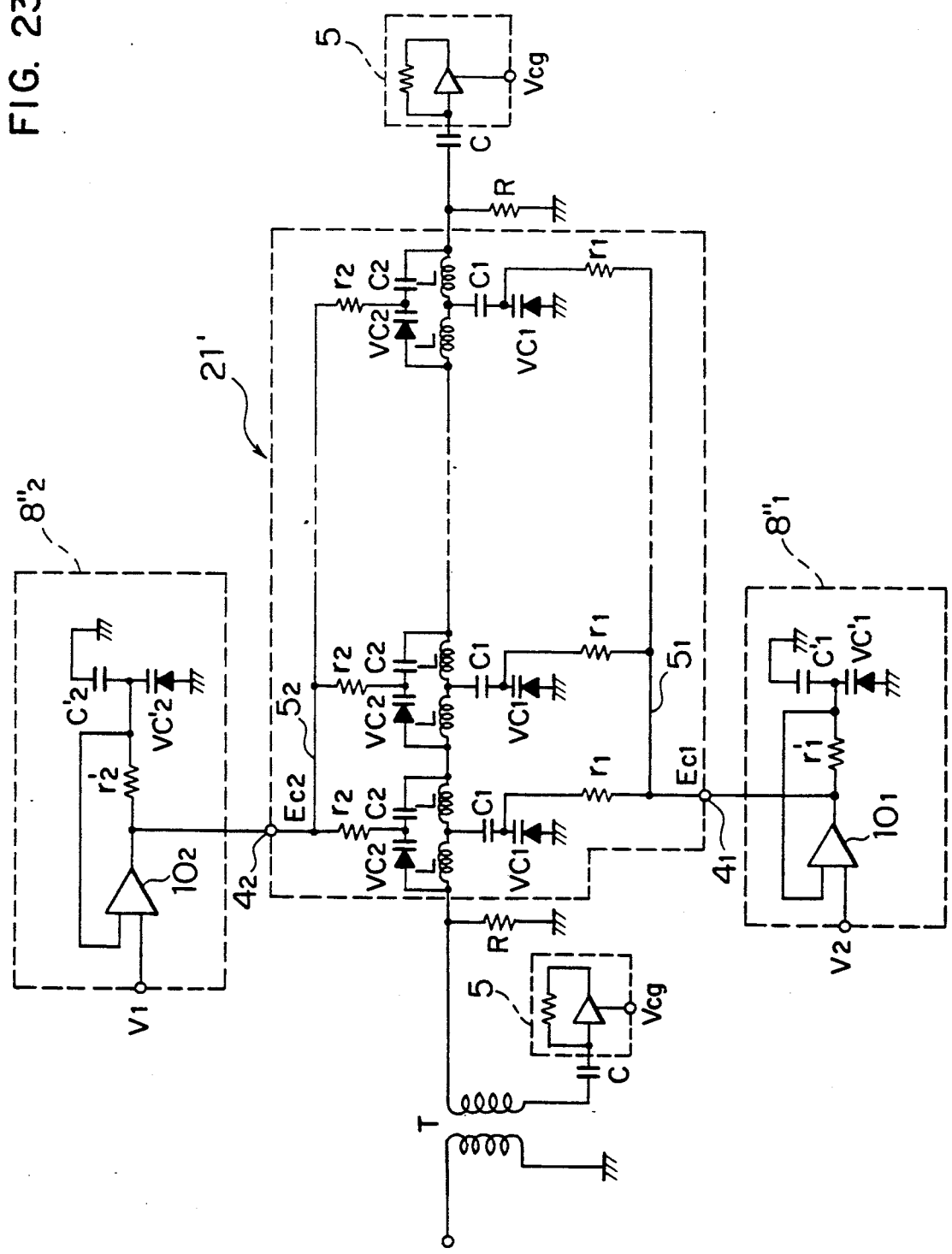
FIG. 23 is a scheme indicating still another embodiment of the fourth delay line according to the present invention.

FIG. 23 is a circuit diagram indicating a third embodiment of the fourth delay line. In this embodiment, one variable capacitance diode VC$_1$ and a fixed capacitor C$_1$ are connected in series and on the other hand another variable capacitance diode VC$_2$ and a fixed capacitor C$_2$ are connected in series. The unit portion is constructed by combining them with inductors L, L and the delay line 21' is formed by connecting a number of unit portions thus obtained in cascade. Further, also within the first and the second negative feedback control circuit 8$_1''$ and 8$_2''$, variable capacitance diodes VC$_1'$ and VC$_2'$ are connected with fixed capacitors C$_1'$ and C$_2'$ respectively, in series. Since the operation in this case is identical to the embodiment, explanation thereof in detail will be omitted.

Although, in the above, explanation has been made, using second order all pass type delay lines as examples, the present invention is not thereto, but it may be applied also to an induced M type variable delay line described as another embodiment and same effects as those described above are obtained. Since the operation in this case is also identical to the embodiment indicated in FIG. 19, explanation thereof in detail will be omitted.

Next another embodiment of the matching circuit will be explained.

Figure 24:
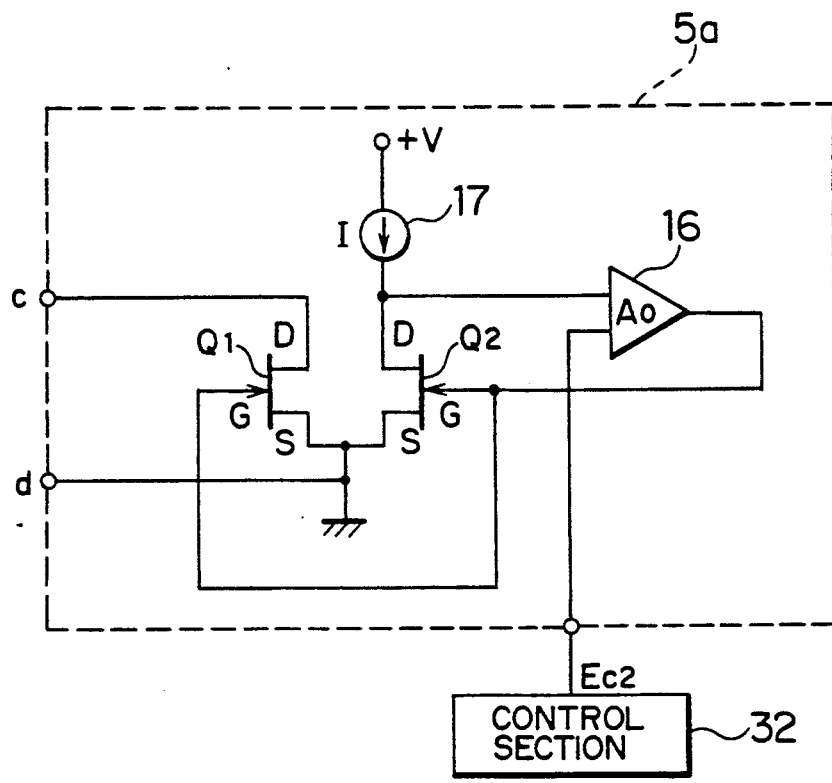
FIG. 24 is scheme indicating another embodiment of the matching circuit according to the present invention.

FIG. 24 indicates another embodiment of the variable resistance circuit 5.

As indicated in FIG. 24, this variable resistance circuit 5a is provided with an element, in which two field effect transistors Q$_1$ and Q$_2$ having identical characteristics are arranged closely to each other. The difference between the potential difference between the source and the drain of one of the field effect transistors Q$_2$, with which a constant current source is connected at the drain and the control voltage (E$_{c2}$) is taken out through an amplifier 16. This difference voltage is sent to the gate of the one field effect transistor Q$_2$ to effect negative feedback and at the same time this gate voltage is applied to the gate of the other field effect transistor Q$_1$ so that the resistance between the source and the drain of the other field effect transistor Q$_1$ is set, corresponding to the control voltage (E$_{c2}$) described above. Junction type field effect transistors are used for the two field effect transistors Q$_1$ and Q$_2$ described above. It is possible to obtain an element having a construction, in which temperature difference between the two field effect transistors Q$_1$ and Q$_2$ described above is extremely small, e.g. by forming these two junction type field effect transistors on a same silicon substrate, arranged closely to each other.

The constant current source 17 is connected with the drain electrode of the one field effect transistor Q$_2$ and the voltage difference between the potential difference between the source and the drain of the field effect transistor Q$_2$ and the control voltage E$_{c2}$ from a control section 32 is amplified by the amplifier 16. They are so wired that this output voltage is sent to the gate of the field effect transistor Q$_2$ to effect negative feedback. Therefore, if the voltage +V and the current I supplied to the constant current source 17 are determined so that the one field effect transistor Q$_2$ is driven in an unsaturated region, the drain voltage of the field effect transistor Q$_2$ stated above is represented by R$_{ds}$·I due to the resistance R$_{ds}$ between the source and the drain of the field effect transistors Q$_2$ controlled by the gate voltage.

Since the resistance R$_{ds}$ stated above between the source and the drain is controlled by the gate voltage V$_{gs}$, denoting the control constant by K, $$R_{ds} = -K \cdot V_{gs} \tag{9}$$

is valid. Further, since the gate voltage V$_{gs}$ is obtained by amplifying the difference voltage between the drain voltage R$_{ds}$·I of the field effect transistors Q$_2$ and the control voltage E$_{c2}$ from the control section 32 by means of the amplifier 16, denoting the gain of the amplifier 16 stated above by A$_0$, following equations are obtained;

$$V_{gs} = (R_{ds} \cdot I - E_{c2})A_0$$

$$\therefore R_{ds} = -K \cdot (R_{ds} \cdot I - E_{c2})A_0 \tag{10}$$

Here, if the gain A$_0$ of the amplifier 16 stated above is sufficiently great to satisfy $-KA_0 > 1$, $R_{ds}/KA_0 \approx 0$. Thus, from Eq. (8)

$$R_{ds}I - E_{c2} = 0$$

is obtained. Therefore $$R_{ds} = E_{c2}/I \qquad (9)$$

is valid. From this Eq. (9), it can be understood that the resistance $R_{ds}$ between the source and the drain can be controlled so as to be proportional to the control voltage $E_{c2}$ stated above. In this case, even if the resistance $R_{ds}$ between the source and the drain of the junction type field effect transistor $Q_2$ controlled by the gate electrode $V_{gs}$ is varied by temperature variations, i.e. even if the constant K in Eq. (7) stated above is varied by temperature variations, if the gain $A_0$ of the amplifier 16 is sufficiently large, it is possible to set the resistance $R_{ds}$ stated above at a value corresponding to the control voltage $E_{c2}$. Further the resistance $R_{ds}$ stated above can be set also by varying the current I of the constant current source 17, keeping the control voltage $E_{c2}$ constant.

On the other hand, since two field effect transistors $Q_1$ and $Q_2$ having identical characteristics are used and they are arranged closely to each other, the temperature difference between them is small. Further, when the gate voltage $V_{gs}$ applied to the gate of the one field effect transistor $Q_2$ is applied to the gate of the other field effect transistor $Q_1$, the resistance between the source and the drain of this field effect transistor $Q_1$ is completely identical to the resistance between the source and the drain of the one field effect transistor $Q_2$. By the operation as described above, in the case where the two field effect transistors $Q_1$ and $Q_2$ have identical characteristics, when the current intensity I of the constant current source 17 is precisely determined, it is possible to set the resistance between the source and the drain of the other field effect transistor $Q_1$ at a value, which is proportional to the control voltage $E_{c2}$ outputted by the control section 32, independently of the characteristics thereof. Consequently the resistance between terminals c and d can be used as the matching resistance for the variable delay line indicated in each of the embodiments.

Figures 25A, 25B, 25C:
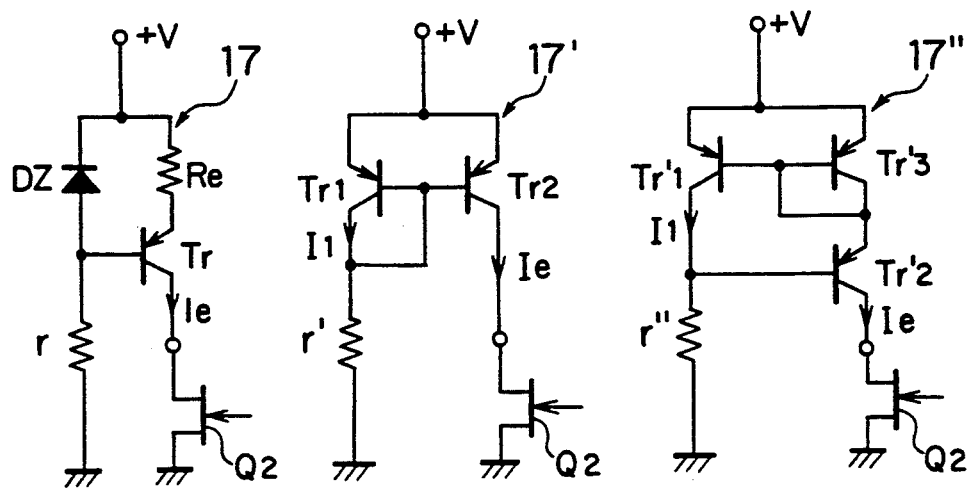
FIGS. 25A, 25B and 25C are schemes indicating concrete examples of the constant current source indicated in FIG. 24.

FIGS. 25A, 25B and 25C are circuit diagrams showing the internal structure of the constant current source 17 indicated in FIG. 24. At first, in the constant current source 17 indicated in FIG. 25A if the forward current amplification factor $h_{fe}$ of a transistor Tr is sufficiently large, the constant current I is given by a following formula, using the voltage $V_z$ of a Zener diode DZ and a resistance Re connected with an emitter of the transistor Tr;

$$I = (V_z - V_{be})/Re$$

where $V_{be}$ represents the voltage between the emitter and the base of the transistor Tr stated above. The constant current source 17 thus constructed is a circuit, which is not influenced by variations in the power supply voltage.

Next, in the constant current source 17' indicated in FIG. 25B, the output resistance of a bipolar transistor is utilized, in which a symbol $Tr_2$ is a constant current transistor, which supplies a constant current I to a field effect transistor $Q_2$ indicated in FIG. 24. A bias transistor $Tr_1$ and a resistor r' constitutes a biasing circuit and the current $I_1$ fluoring through the transistor $Tr_1$ stated above is given by;

$$I_1 = (V - V_{be})/r'.$$

Further the relationship between the emitter current $I_e$ of the transistor and the emitter-base voltage $V_{be}$ is expressed by a following formula;

$$I_e = I_s \cdot \exp\frac{q}{kT} V_{be}$$

where k is the Boltzmann's constant; T is the ambient temperature; q is the charge of an electron; and $I_s$ is the saturation current, which is a quantity proportional to the area of the emitter. Consequently, denoting the areas of the emitters of the two transistors $Tr_1$ and $Tr_2$ by $A_1$ and $A_2$, respectively, when they are integrated, if the two transistors $Tr_1$ and $Tr_2$ are arranged closely to each other, since all the terms other than the area of the emitter in the saturation current $I_s$ are almost equal for the two transistors, neglecting the base current, the collector current I of the constant current transistor $Tr_2$ is given by;

$$I = \frac{A_2}{A_1} I_1 \approx \frac{V}{R_1} \cdot \frac{A_2}{A_1}$$

This constant current is supplied to the field effect transistor $Q_2$.

Next a constant current source 17'' indicated in FIG. 25C is an improved version of the constant current source 17' in FIG. 25B described above. This circuit is so constructed that the base current of the constant current transistor $Tr_2'$ is taken out from the bias current $I_1$ and on the contrary the base current of the bias transistor $Tr_1'$ is supplied from the constant current transistor $Tr_2'$ described above. Consequently influences of the base current is reduced significantly. Here, supposing that the forward current amplification factor $h_{fe}$ of all the transistors $Tr_1'$, $Tr_2'$, $Tr_e'$ is constant, the constant current I is given by;

$$I = I_1 \left(1 - \frac{2}{h_{fe}^2 + 2h_{fe} + 2}\right)$$

Therefore, supposing that $h_{fe}$ is e.g. 100, the error factor is smaller than 0.02% and it is possible to make are integrated circuit thereof connected with the field effect transistor $Q_2$ exhibit a required function.

Figure 26:
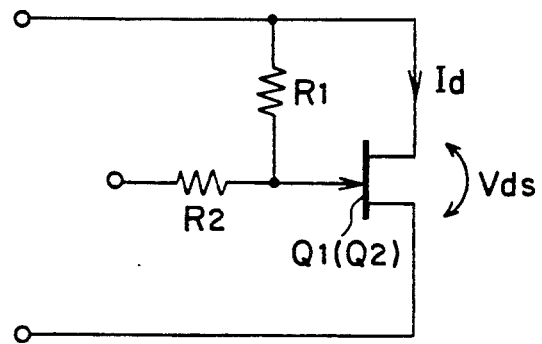
FIG. 26 is a scheme indicating another embodiment of the matching circuit indicated in FIG. 24.

In the variable resistance circuit 5a indicated in FIG. 24, since the drain current $I_d$ is not precisely proportional to the source-drain voltage $V_{ds}$ of the field effect transistors $Q_1$ and $Q_2$, non-linearity distortions take place in the signal, which gives rise to a case where the variable delay line is not well matched, depending on the magnitude of the signal. Such a case can be improved by effecting negative feedback to the gate by using a circuit construction indicated in FIG. 26.

Figure 27:
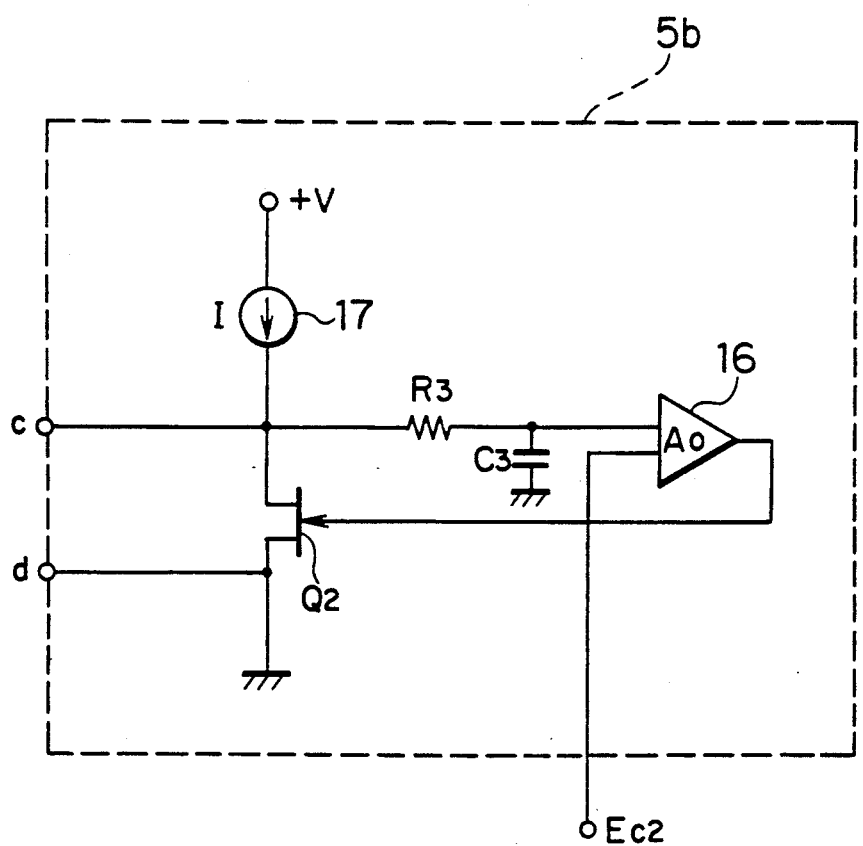
FIG. 27 is a scheme indicating still another embodiment of the matching circuit according to the present invention.

FIG. 27 is a circuit diagram showing another embodiment 5b of the variable resistance circuit. Contrarily to the example indicated in FIG. 24, in which two field effect transistors $Q_1$ and $Q_2$ having identical characteristics are used, in the variable resistance circuit 5b according to this embodiment, the difference between the potential difference between the source and the drain of one of the field effect transistors $Q_2$ and the control voltage ($E_{c2}$) is taken out by an amplifier 16 and this difference voltage is fed back negatively to the gate of the field effect transistor $Q_2$ so that the resistance between the source and the drain of the field effect transistor $Q_2$ is set, corresponding to the control voltage ($E_{c2}$) described above. A junction type field effect transistor is used for the field effect transistor $Q_2$ stated above.

In the case of the embodiment indicated in FIG. 27, the resistance $R_{ds}$ between the source and the drain of the field effect transistor $Q_2$ is set at a desired value by the control using the negative feedback and the resistance $R_{ds}$ between the source and the drain of the field effect transistor $Q_2$ described above can be used as a matching resistance for the delay line indicated in the different embodiments if the control for compensating variations in the characteristics due to temperature variations in the field effect transistor $Q_2$ is sufficiently slow with respect to the ultrasonic echo signal and the frequency band of the amplifier 16 is narrower than the frequency band of the ultrasonic echo signal for the purpose of reducing the response speed of the control system, because the control speed (kHz order) for the resistance $R_{ds}$ by varying the control voltage $E_{c2}$ is also sufficiently slow with respect to the ultrasonic echo signal (MHz order). In FIG. 27, a resistor $R_3$ and a capacitor $C_3$ constitute a low pass filter so that no ultrasonic signals enter the amplifier 16. In this way, the voltage applied to the drain of the field effect transistor $Q_2$ by ultrasonic signals between terminals c and d is not transmitted to the gate owing to the feedback loop. Therefore the resistance $R_{ds}$ described above is controlled so as to be constant, similarly to the case of the one field effect transistor $Q_2$ in the circuit indicated in FIG. 24 so that it is possible to use the resistance between the terminals c and d stated above as the matching resistance for the variable delay line.

Figure 28:
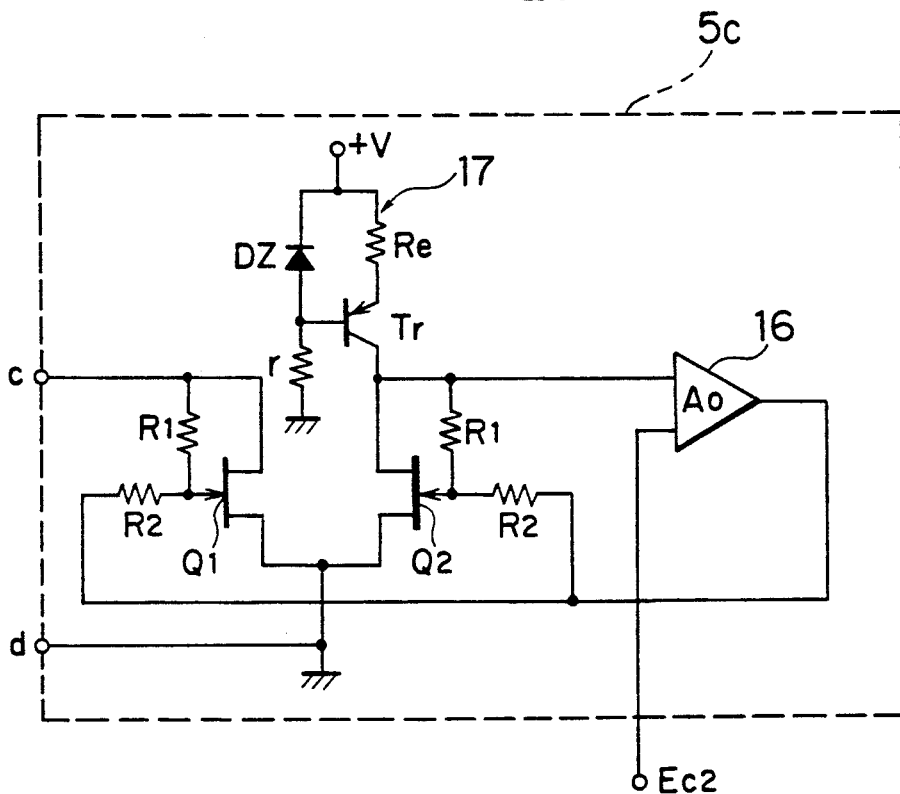
FIG. 28 is a scheme indicating still another embodiment of the matching circuit according to the present invention.

FIG. 28 is a circuit diagram indicating still another embodiment 5c of the variable resistance circuit. In this embodiment, the non-linearity in the relation between the voltage $V_{ds}$ between the source and the drain and the drain current $I_d$ is improved by applying the circuit indicated in FIG. 26 to the circuit indicated in FIG. 24 and by effecting negative feedback to two junction type field effect transistors $Q_1$ and $Q_2$ through resistances $R_1$ and $R_2$. It shows further an example, to which the circuit indicated in FIG. 25A is applied for the constant current source 17. In this case, by using the control voltage $E_{c2}$, the resistance between the terminals c and d can be controlled so as to be proportional to the voltage $E_{c2}$ stated above. In addition, when the characteristics of the two field effect transistors $Q_1$ and $Q_2$ are identical to each other, even if there are fluctuations in the characteristics at mass production thereof and the characteristics vary due to variations in the ambient temperature, no errors are produced in the resistance set by the control voltage $E_{c2}$ by using an amplifier 16 having a sufficiently great gain $A_0$.

Figure 29:
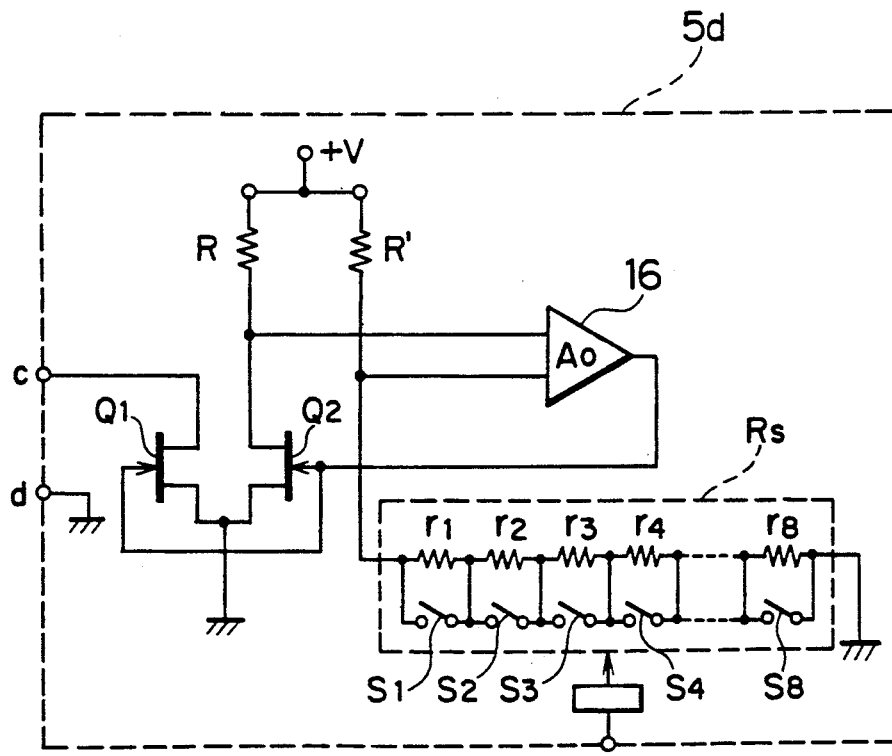
FIG. 29 is a scheme indicating still another embodiment of the matching circuit according to the present invention.

FIG. 29 is a circuit diagram indicating still another embodiment 5d of the variable resistance circuit. In this embodiment a resistance bridge is composed of resistances R and R', one of the junction type field effect transistors $Q_2$, and a resistance circuit network $R_s$, whose resistance can be controlled by external digital signals by short-circuiting resistors $r_1, r_2, \ldots, r_8$, whose resistance are weighted, by using analogue switches $S_1, S_2, \ldots, S_8$ which can be externally on-off controlled. Here supposing that R=R', when an unbalanced voltage of this resistance bridge is detected by the amplifier 16 and negative feedback to the gate of the one field effect transistor $Q_2$ is effected so that the resistance $R_{ds}$ between the source and the drain is varied, the resistance $R_{ds}$ is identical to the value set for the resistance circuit network $R_s$. Using two field effect transistors $Q_1$ and $Q_2$ having characteristics identical to each other, supposing that they are at a same temperature, the resistance $R_{ds}$ between the source and the drain of the one field effect transistors $Q_2$ is controlled so as to be a value identical to that set for the resistance circuit network $R_s$ and it is possible to use the resistance between the terminals c and d as a matching resistance for the variable delay line indicated in the different embodiments. In this case, in order to hinder influences of noise accompanied by turning-on and off of the analogue switches $S_1$ to $S_8$ described above, it is required to take a measure, by which the response characteristics of the amplifier 16 is made appropriately slow.

As explained above, in the variable resistance circuits 5a, 5c and 5d, since the part connected with the variable delay line and driven by making a high frequency signal (e.g. 1 to 10 MHz) flow therethrough is dealt with only between the drain and the source of the other field effect transistor $Q_1$ and the other part deals with a low frequency signal controlling the resistance, no high speed elements are required. Consequently it is sufficient to perform a design corresponding to the video signal frequency by using only the two field effect transistors $Q_1$ and $Q_2$. Further, since neither high speed elements nor high frequency signals are used for the mounting of the circuit, fabrication cost is reduced. Although junction type field effect transistors are used for the field effect transistors $Q_1$ and $Q_2$ in the above explanation, the present invention is not restricted thereto, but MOS type field effect transistors having characteristics, by which the drain current is proportional to the voltage between the source and the drain in a wide range, may be used therefor.

We claim:

1. A delay circuit of ultrasonic diagnostic apparatus comprising:
   (a) delaying means consisting of a plurality of unit portions connected in cascade, in each of which at least an anode of a first variable capacitance diode and a cathode of a second variable capacitance diode are connected with a connecting point of two inductors connected in series;
   (b) means for applying a reverse bias voltage to each of said first and said second variable capacitance diode; and
   (c) matching means for said delaying means.

2. A delay circuit according to claim 1, wherein said matching means includes:
   a variable gain amplifier; and
   a voltage applying means for controlling said variable gain amplifier.

3. A delay circuit according to claim 1, wherein said matching means includes:
   a first field effect transistor driven by a constant current source;
   amplifying means for amplifying a difference between a potential difference between a source and a drain of said first field effect transistor and a control voltage disposed for controlling a matching impedance;
   means for applying an output of said amplifying means to a gate of said first field effect transistor to effect negative feedback;

means for effecting said negative feedback to a gate of said second field effect transistor; and means for supplying a resistance between a source and a drain of said second field effect transistor as a matching resistance.

4. A delay circuit according to claim 1, wherein said matching means includes:
a field effect transistor driven by a constant current source;
amplifying means for amplifying a difference between a potential difference between a source and a drain of said field effect transistor and a control voltage disposed for controlling a matching impedance;
means for applying an output of said amplifying means to a gate of said field effect transistor to effect negative feedback; and
means for supplying a resistance between the source and the drain of said field effect transistor as a matching resistance.

5. A delay circuit of ultrasonic diagnostic apparatus comprising:
(a) delaying means consisting of a plurality of unit portions connected in cascade, in each of which at least an anode of a first pair of variable capacitance diodes connected in series by connecting cathodes thereof with each other is connected with a connecting point of two inductors connected in series and a second pair of variable capacitance diodes connected in series by connecting cathodes thereof with each other is connected is parallel with said two inductors;
(b) means for applying a reverse bias voltage to each of said first and said second pair of variable capacitance diodes through a resistance; and
(c) matching means for said delaying means.

6. A delay circuit according to claim 5, further comprising:
a third pair of variable capacitance diodes connected in series by connecting cathodes thereof with each other;
amplifying means for amplifying difference voltage between a reverse bias voltage applied to said third pair of variable capacitance diodes and a reference voltage disposed separately;
means for applying an output of said amplifying means to said third pair of variable capacitance diodes as a reverse bias voltage; and
means for applying the output of said amplifying means to said first or said second pair of variable capacitance diodes as a reverse bias voltage.

7. A delay circuit according to claim 5, further comprising:
amplifying means for amplifying a difference voltage between a reverse bias voltage applied to said first or said second pair of variable capacitance diodes and a reference voltage disposed separately; and
means for applying an output of said amplifying means to said first or said second pair of variable capacitance diodes as a reverse bias voltage.

8. A delay circuit according to claim 5, wherein said matching means includes:
a variable gain amplifier; and
a voltage applying means for controlling said variable gain amplifier.

9. A delay circuit according to claim 5, wherein said matching means includes:
a first field effect transistor driven by a constant current source;
amplifying means for amplifying a difference between a potential difference between a source and a drain of said first field effect transistor and a control voltage disposed for controlling a matching impedance;
means for applying an output of said amplifying means to a gate of said first field effect transistor to effect negative feedback;
means for effecting said negative feedback to a gate of said second field effect transistor; and
means for supplying a resistance between a source and a drain of said second field effect transistor as a matching resistance.

10. A delay circuit according to claim 5, wherein said matching means includes:
a field effect transistor driven by a constant current source;
amplifying means for amplifying a difference between a potential difference between a source and a drain of said field effect transistor and a control voltage disposed for controlling a matching impedance;
means for applying an output of said amplifying means to a gate of said field effect transistor to effect negative feedback; and
means for supplying a resistance between the source and the drain of said field effect transistor as a matching resistance.

11. A delay circuit of ultrasonic diagnostic apparatus comprising:
(a) delaying means consisting of a plurality of unit portions connected in cascade, in each of which at least an anode of a first pair of variable capacitance diodes connected in series by connecting cathodes thereof with each other is connected with a connecting point of first two inductors connected in series and the other anode of said pair of variable capacitance diodes is connected with a connecting point of second two inductors connected in series to constitute a balanced circuit;
(b) means for applying a reverse bias voltage to said pair of variable capacitance diodes; and
(c) matching means for said delaying means.

12. A delay circuit according to claim 11, wherein said delaying means includes;
transformers disposed at a signal output portion and at a signal input portion of said delaying means, an intermediate tap being disposed on one winding connected with said delaying means between two windings of each of said transformers.

13. A delay circuit according to claim 12, further comprising:
a second pair of variable capacitance diodes connected in series by connecting cathodes thereof with each other;
amplifying means for amplifying a difference voltage between a reverse bias voltage applied to said second pair of variable capacitance diodes and a reference voltage disposed separately;
means for applying an output of said amplifying means to said second pair of variable capacitance diodes as a reverse bias voltage; and
means for applying the output of said amplifying means to said first pair of variable capacitance diodes as a reverse bias voltage.

14. A delay circuit according to claim 12, further comprising:
   amplifying means for amplifying a difference voltage between a reverse bias voltage applied to said first pair of variable capacitance diodes and a reference voltage disposed separately; and
   means for applying an output of said amplifying means to said first pair of variable capacitance diodes as a reverse bias voltage.

15. A delay circuit according to claim 12, wherein said matching means includes:
   a variable gain amplifier; and
   a voltage applying means for controlling said variable gain amplifier.

16. A delay circuit according to claim 12, wherein said matching means includes:
   a first field effect transistor driven by a constant current source;
   amplifying means for amplifying a difference between a potential difference between a source and a drain of said first field effect transistor and a control voltage disposed for controlling a matching impedance;
   means for applying an output of said amplifying means to a gate of said first field effect transistor to effect negative feedback;
   means for effecting said negative feedback to a gate of said second field effect transistor; and
   means for supplying a resistance between a source and a drain of said second field effect transistor as a matching resistance.

17. A delay circuit according to claim 12, wherein said matching means includes:
   a field effect transistor driven by a constant current source;
   amplifying means for amplifying a difference between a potential difference between a source and a drain of said field effect transistor and a control voltage disposed for controlling a matching impedance;
   means for applying an output of said amplifying means to a gate of said field effect transistor to effect negative feedback; and
   means for supplying a resistance between the source and the drain of said field effect transistor as a matching resistance.

18. A delay circuit of ultrasonic diagnostic apparatus comprising:
   (a) delaying means consisting of a plurality of unit portions connected in cascade, in each of which at least a set of a first capacitor and a first variable capacitance diode connected in series is connected with a connecting point of first two inductors connected in series and a set of a second capacitor and a second variable capacitance diode is connected with said two inductors in parallel;
   (b) means for applying a reverse bias voltage to each of said first and said second of variable capacitance diode through a resistance; and
   (c) matching means for said delaying means.

19. A delay circuit according to claim 18, further comprising:
   a third variable capacitance diode connected in series with a third capacitor;
   amplifying means for amplifying a difference voltage between a reverse bias voltage applied to said third variable capacitance diode and a reference voltage disposed separately;
   means for applying an output of said amplifying means to said third variable capacitance diode as a reverse bias voltage; and
   means for applying the output of said amplifying means to said first or said second variable capacitance diode as a reverse bias voltage.

20. A delay circuit according to claim 18, further comprising:
   amplifying means for amplifying a difference voltage between a reverse bias voltage applied to said first or second variable capacitance diode and a reference voltage disposed separately; and
   means for applying an output of said amplifying means to said first or said second variable capacitance diode as a reverse bias voltage.

21. A delay circuit according to claim 18, wherein said matching means includes:
   a variable gain amplifier; and
   a voltage applying means for controlling said variable gain amplifier.

22. A delay circuit according to claim 18, wherein said matching means includes:
   a first field effect transistor driven by a constant current source;
   amplifying means for amplifying a difference between a potential difference between a source and a drain of said first field effect transistor and a control voltage disposed for controlling a matching impedance;
   means for applying an output of said amplifying means to a gate of said first field effect transistor to effect negative feedback;
   means for effecting said negative feedback to a gate of said second field effect transistor; and
   means for supplying a resistance between a source and a drain of said second field effect transistor as a matching resistance.

23. A delay circuit according to claim 18, wherein said matching means includes:
   a field effect transistor driven by a constant current source;
   amplifying means for amplifying a difference between a potential difference between a source and a drain of said field effect transistor and a control voltage disposed for controlling a matching impedance;
   means for applying an output of said amplifying means to a gate of said field effect transistor to effect negative feedback; and
   means for supplying a resistance between the source and the drain of said field effect transistor as a matching resistance.

* * * * *